(12) United States Patent
Maruyama et al.

(10) Patent No.: US 8,482,011 B2
(45) Date of Patent: Jul. 9, 2013

(54) LIGHT-EMITTING DEVICE

(75) Inventors: Junya Maruyama, Ebina (JP); Toru Takayama, Atsugi (JP); Yumiko Ohno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/559,963

(22) Filed: Jul. 27, 2012

(65) Prior Publication Data

US 2012/0299025 A1 Nov. 29, 2012

Related U.S. Application Data

(60) Continuation of application No. 13/278,685, filed on Oct. 21, 2011, now Pat. No. 8,237,176, which is a division of application No. 12/512,418, filed on Jul. 30, 2009, now Pat. No. 8,044,411, which is a division of application No. 11/698,863, filed on Jan. 29, 2007, now Pat. No. 7,569,859, which is a division of application No. 10/733,448, filed on Dec. 12, 2003, now Pat. No. 7,169,636.

(30) Foreign Application Priority Data

Dec. 13, 2002 (JP) ................................. 2002-362352

(51) Int. Cl.
 *H01L 27/15* (2006.01)
 *H01L 31/12* (2006.01)
 *H01L 33/00* (2010.01)

(52) U.S. Cl.
 USPC .................. 257/79; 257/81; 349/73; 313/512

(58) Field of Classification Search
 USPC ... 257/79, 81, 82; 349/73, 114, 153; 313/512, 313/513
 See application file for complete search history.

(56) References Cited

U.S. PATENT DOCUMENTS

| 4,691,995 A | 9/1987 | Yamazaki et al. |
| 5,148,301 A | 9/1992 | Sawatsubashi et al. |

(Continued)

FOREIGN PATENT DOCUMENTS

| EP | 0 854 024 A | 7/1998 |
| JP | 57-162352 A | 10/1982 |

(Continued)

OTHER PUBLICATIONS

European Search Report (Application No. 03028484.8) dated Jun. 23, 2010.

(Continued)

*Primary Examiner* — Phuc Dang
(74) *Attorney, Agent, or Firm* — Eric J. Robinson; Robinson Intellectual Property Law Office, P.C.

(57) ABSTRACT

The present invention provides a structure in which a pixel region 13 is surrounded by a first sealing material (having higher viscosity than a second sealing material) 16 including a spacer (filler, minute particles and/or the like) which maintains a gap between the two substrates, filled with a few drops of the transparent second sealing material 17a which is spread in the region; and sealed by using the first sealing material 16 and the second sealing material 17.

19 Claims, 15 Drawing Sheets

U.S. PATENT DOCUMENTS

| | | | |
|---|---|---|---|
| 5,776,622 A | 7/1998 | Hung et al. |
| 5,874,804 A | 2/1999 | Rogers |
| 5,882,761 A | 3/1999 | Kawami et al. |
| 6,195,142 B1 | 2/2001 | Gyotoku et al. |
| 6,274,887 B1 | 8/2001 | Yamazaki et al. |
| 6,317,186 B1 | 11/2001 | Miwa et al. |
| 6,319,321 B1 | 11/2001 | Hiraga et al. |
| 6,404,532 B1 | 6/2002 | Berneth et al. |
| 6,433,358 B1 | 8/2002 | Beierlein |
| 6,473,148 B1 | 10/2002 | Suh |
| 6,512,271 B1 | 1/2003 | Yamazaki et al. |
| 6,548,960 B2 | 4/2003 | Inukai |
| 6,559,594 B2 | 5/2003 | Fukunaga et al. |
| 6,614,076 B2 | 9/2003 | Kawasaki et al. |
| 6,617,052 B2 | 9/2003 | Morii |
| 6,624,572 B1 | 9/2003 | Kim et al. |
| 6,661,025 B2 | 12/2003 | Hirabayashi |
| 6,758,713 B2 | 7/2004 | Wei et al. |
| 6,791,660 B1 | 9/2004 | Hayashi et al. |
| 6,806,641 B2 | 10/2004 | Ueda et al. |
| 6,833,668 B1 | 12/2004 | Yamada et al. |
| 6,839,122 B2 | 1/2005 | Chung et al. |
| 6,853,130 B2 | 2/2005 | Morii |
| 6,869,635 B2 | 3/2005 | Kobayashi |
| 6,911,675 B2 | 6/2005 | Kato et al. |
| 6,930,745 B1 | 8/2005 | Miyazaki et al. |
| 7,011,562 B2 | 3/2006 | Kim et al. |
| 7,112,115 B1 | 9/2006 | Yamazaki et al. |
| 7,151,016 B2 * | 12/2006 | Kajiwara et al. | 438/149 |
| 7,169,636 B2 | 1/2007 | Maruyama et al. |
| 7,176,624 B2 | 2/2007 | Kim et al. |
| 7,208,868 B2 | 4/2007 | Ueda et al. |
| 7,291,970 B2 | 11/2007 | Kuwabara |
| 7,426,010 B2 | 9/2008 | Lee et al. |
| 7,700,958 B2 * | 4/2010 | Nishi et al. | 257/88 |
| 7,977,876 B2 | 7/2011 | Yamazaki et al. |
| 2002/0193035 A1 | 12/2002 | Wei et al. |

FOREIGN PATENT DOCUMENTS

| | | |
|---|---|---|
| JP | 64-054420 A | 3/1989 |
| JP | 04-212284 | 8/1992 |
| JP | 04-267097 | 9/1992 |
| JP | 05-005890 A | 1/1993 |
| JP | 06-176867 | 6/1994 |
| JP | 08-124677 | 5/1996 |
| JP | 2776040 | 5/1998 |
| JP | 10-202153 A | 8/1998 |
| JP | 10-275680 | 10/1998 |
| JP | 2000-036384 A | 2/2000 |
| JP | 2000-068050 A | 3/2000 |
| JP | 2000-133445 A | 5/2000 |
| JP | 2000-150145 | 5/2000 |
| JP | 2001-126866 A | 5/2001 |
| JP | 2001-133795 | 5/2001 |
| JP | 2001-185348 | 7/2001 |
| JP | 2001-203076 | 7/2001 |
| JP | 2001-297878 A | 10/2001 |
| JP | 2001-338771 | 12/2001 |
| JP | 2001-357973 | 12/2001 |
| JP | 2002-134272 | 5/2002 |
| JP | 2002-198170 A | 7/2002 |
| JP | 2002-317263 A | 10/2002 |
| JP | 2003-243161 | 8/2003 |
| JP | 2004-022277 | 1/2004 |
| TW | 426612 | 3/2001 |
| TW | 493358 | 7/2002 |
| TW | 508976 | 11/2002 |

OTHER PUBLICATIONS

Taiwanese Office Action (Application No. 92135259) dated Mar. 17, 2011.

* cited by examiner

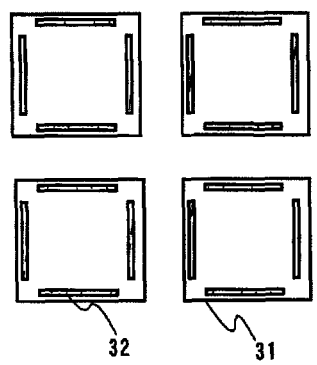
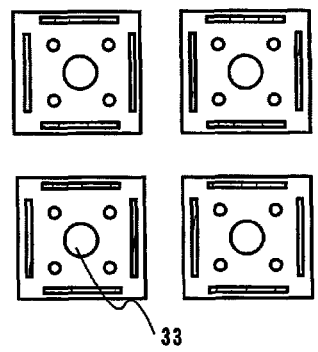
Fig. 3A          Fig. 3B
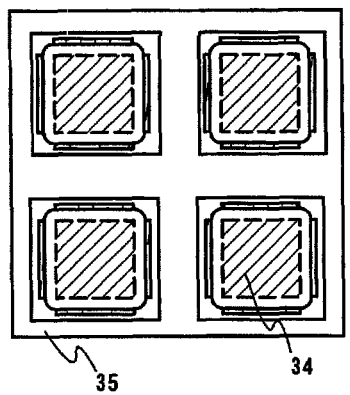
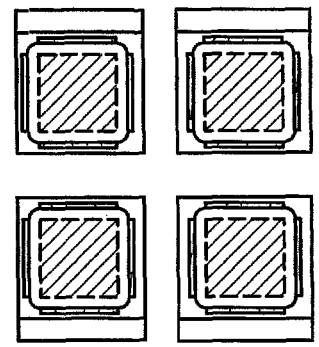
Fig. 3C          Fig. 3D

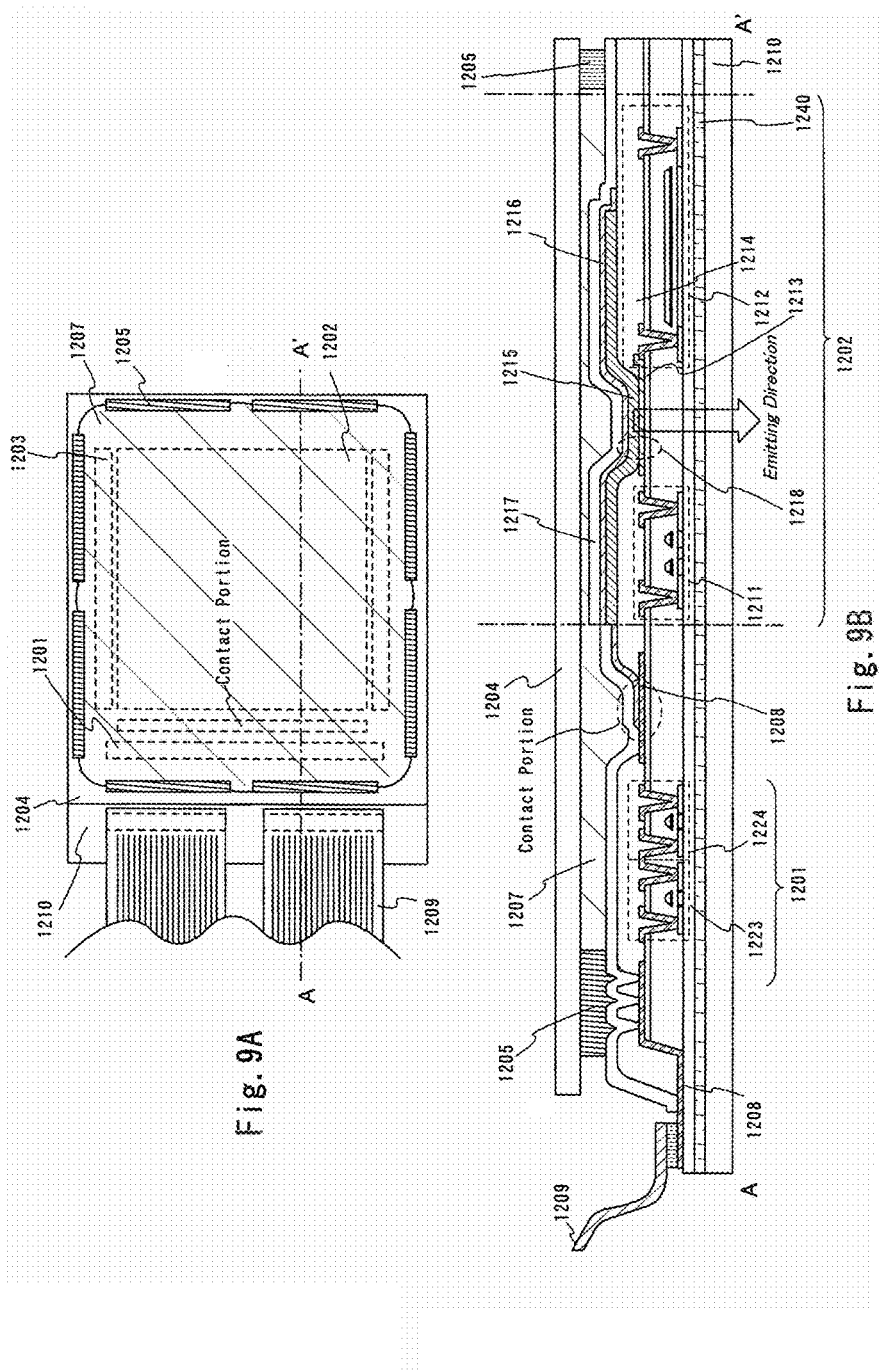

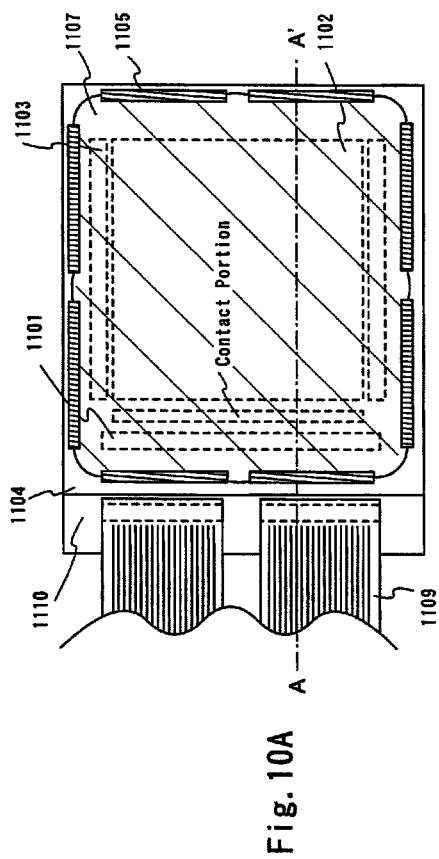
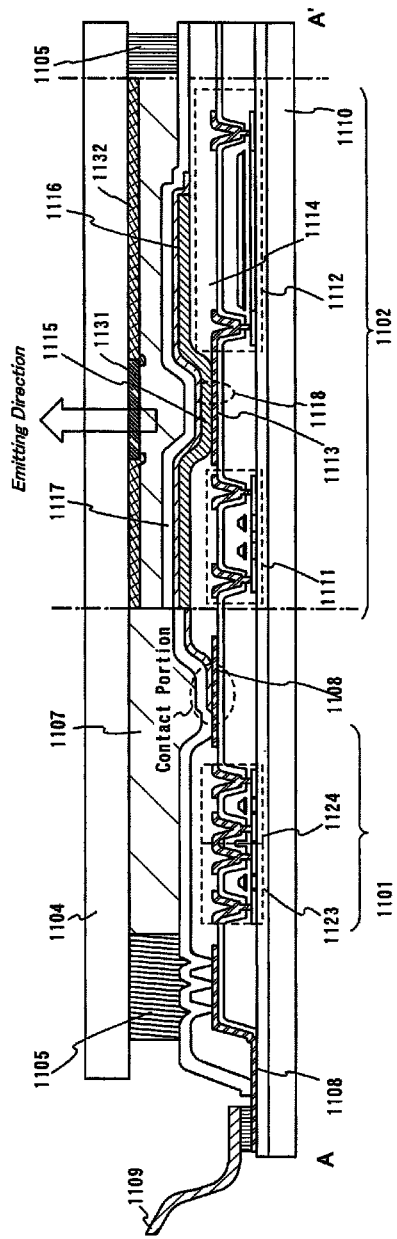
Fig. 10A
Fig. 10B

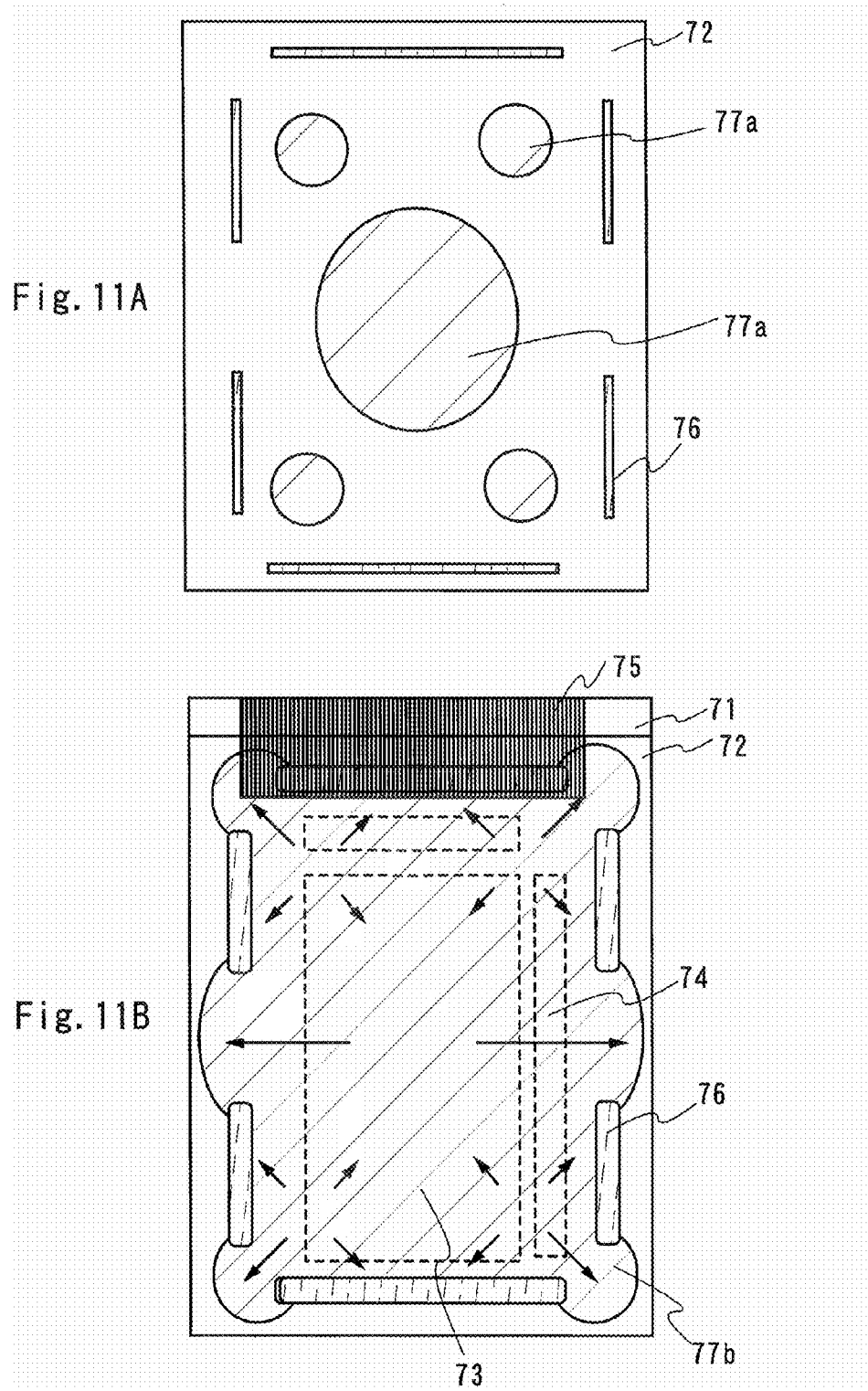

LIGHT-EMITTING DEVICE

BACKGROUND OF THE INVENTION

1. Field of the Invention

The present invention relates to a manufacturing device provided with a pasting structure for a sealing substrate which seals elements (typically, a semiconductor element, a light emitting element, a memory element, a sensor, or a photoelectric transducer, each formed from a thin film transistor (hereinafter referred to as a TFT)). More particularly, the present invention relates to a pasting device for a sealing substrate which seals a light emitting element on the occasion of manufacturing a light emitting device which has a layer containing an organic compound as a light emitting layer.

2. Description of the Related Art

Recently, researches on a light emitting device comprising an EL element as a self luminous light emitting element are revitalized. This kind of light emitting device is called an organic EL display or an organic light emitting diode. Such light emitting devices have characteristics such as high response speed which suitable for displaying moving images, low voltage drive, and low power consumption, so that the light emitting devices draw keen attention as new-generation displays for mobile phones, personal digital assistants (PDA), and the like.

An EL element includes a layer containing an organic compound wherein electro luminescence can be obtained by applying electric field thereto, an anode, and a cathode. The luminescence with an organic compound can be broadly classified into two types: one is emitted when the singlet excited state returns back to the ground state (fluorescent light) and another that is emitted when the triplet excited state returns back to the ground state (phosphorescent light). Either or both types of the luminescence can be used for a light emitting device manufactured by a film forming mechanism and a film formation method according to the present invention.

A light emitting device has no problem with the viewing angle because it is a self luminous type, different from a liquid crystal display device. Accordingly, a light emitting device is better suited for outdoor use than a liquid crystal device, and various usages are suggested.

An EL element has a structure wherein an EL layer is sandwiched between a pair of electrodes, and an EL layer generally has a laminated structure. A laminated structure of "a hole transporting layer/a light emitting layer/an electron transporting layer" can be given as a typical structure. This structure brings extremely high luminous efficiency, so that most of the light emitting devices developed nowadays employs this structure.

Further, structures having the following layers laminated in order over an anode are also applicable: a hole injecting layer/a hole transporting layer/a light emitting layer/an electron transporting layer, and a hole injecting layer/a hole transporting layer/a light emitting layer/an electron transporting layer/an electron injecting layer. Fluorescent pigments or the like may also be doped into the light emitting layer. Furthermore, these layers may be formed from either of low molecular weight materials or polymer materials.

Note that, in this specification, all the layers provided between a cathode and an anode are referred to as EL layers generically. Accordingly, the above layers: a hole injecting layer, a hole transporting layer, a light emitting layer, an electron transporting layer, and an electron injecting layers shall be all included in an EL layer.

Furthermore, in this specification, a light emitting element formed from a cathode, an EL layer, or an anode is referred to as an EL element. The EL element is formed by two systems: a system in which an EL layer is formed between two types of stripe electrodes arranged so as to cross at right angles to one another (simple matrix system); and another system in which an EL layer is formed between a pixel electrode and a counter electrode, which are arranged in matrix and connected to a TFT (active matrix system). However, when the pixel density is increased, an active matrix system wherein a switch is provided for each pixel (or a dot) is considered advantageous because it is available for low voltage drive.

Further, an EL material forming an EL layer deteriorates extremely easily, and is easily oxidized or absorbs moisture. Therefore, a light emitting element has a problem of a decline in luminance or short lifetime.

Accordingly, in prior art, a light emitting element is covered with an encapsulating can; the interior is filled with dry air; and a desiccant is further adhered thereto, thereby preventing oxygen or moisture from reaching to the light emitting element.

SUMMARY OF THE INVENTION

It is an object of the present invention to provide a light emitting device having a structure wherein oxygen and moisture are prevented from reaching to the light emitting device, and to provide a manufacturing method thereof. It is another object of the present invention to seal a light emitting device in fewer steps without encapsulating a desiccant.

The present invention further provides a pasting device which can mate substrates having unevenness or flexible substrates to a substrate provided with a light emitting element.

A substrate provided with a light emitting element and a transparent sealing substrate are pasted together in the present invention. When two substrates are pasted together, the entire surface of a pixel region is covered with a second sealing material that is transparent, surrounded by a first sealing material including a spacer (filler, minute particles and/or the like) which maintains a gap between the two substrates, and sealed with a first sealing material (having higher viscosity than the second sealing material) and the second sealing material.

When the first sealing material is patterned to have a shape of square, or U-shape, and the second sealing material with a lower viscosity is applied to paste the two substrates, air bubbles may be remain at the corners.

Especially, film-like substrates which are soft like plastic have tendency for air bubbles to generate easily.

In the case where two film substrate are pasted together by applying a drop of the second sealing material to the central part of the substrate, the sealing material spreads concentrically, so that it is difficult to make the sealing material spread all over.

Accordingly, in the present invention, the pattern of the first sealing material shall be a pattern without bending (bar shape) but not square, or U-shape. The corners are provided with opening portions (on four parts); a rather larger amount of a drop of the second sealing material is applied to the central part surrounded by the first sealing material, and a rather smaller amount of a few drops thereof are applied to the surrounding area.

When two substrates are pasted together, the second sealing material with a low viscosity is squeezed out to the direction of the opening portions which are provided at the corners, thereby sealing without air bubbles mixed in the pixel region. It is preferable that the surface of the substrate, which is to be sealed, shall preferably be well flattened and smooth thereby preventing air bubbles from mixing in.

Especially, that helps in pasting thin substrates like film substrates. Further, that helps in pasting a thin separated layer (without a substrate) which is separated from a glass substrate, to a film substrate. In an experiment where more than a drop of the second sealing material is applied, the second sealing material does not spread all over due to the lack of the amount applied to the central part; or the second sealing material applied to the periphery spreads exceedingly and/or reaches to the edge (or the back) of the substrate.

In view of the above problem, the present invention provides a manufacturing device in which a surface of a substrate tray or a substrate stage is coated with Teflon or diamond like carbon (hereinafter referred to as DLC) thereby making the substrate hardly adhere to the substrate. That lessens the problem that the sealing material spreads excessively and reaches to the edge (or the back) of the substrate. Alternatively, the substrate tray or substrate stage itself may be formed from a material which hardly adheres to the second sealing material. A manufacturing device according to the present invention provides broad range of pasting conditions on such as the amount of the second sealing material to be applied, the position where the sealing material is applied, the bonding pressure, or the like.

The first sealing material with higher viscosity maintains a gap between substrates with a spacer, and shapes the second sealing material to have flatness. The first sealing material can be a mark for dividing the substrates. For example, in the case where plural panels are manufactured from one substrate, the substrate can be divided along the first sealing material.

When a substrate is hit by external shocks, the portion of the first sealing material disposed outside the pixel area shall be affected most, so that the pixel area itself can be unaffected. Thus, a light emitting device can have more mechanical strength by using the structure according to the present invention.

A light emitting element can be protected from oxygen and moisture owing to be sealed with the first sealing material, the second sealing material, and the substrates. Note that, a pair of substrates is preferably pasted together under reduced pressure or in a nitrogen atmosphere.

A constitution of the present invention in this specification discloses a manufacturing method of a light emitting device including a pixel portion provided with a plurality of light emitting elements having a first electrode, an organic compound layer in contact with a top portion of the first electrode, and a second electrode in contact with a top portion of the organic compound layer, between a pair of substrates, at least one of which is transparent, the manufacturing method of a light emitting device comprising the steps of:
  forming a pixel portion on one of the substrates;
  figuring a first sealing material having a bar shape on the other substrate;
  applying a plurality of drops of a second sealing material having lower viscosity than the first sealing material to a region surrounded by the first sealing material so that an amount of drops differs depending on a region to be applied to; and
  arranging the first sealing material to surround the pixel region, and filling a space between at least a pair of the first sealing materials with the second sealing material for pasting a pair of substrates.

In the above constitution, the second sealing material is applied at least to a central part of a pixel portion and to the position surrounding the central part with a constant distance therefrom; and an amount of the second sealing material applied to the central part is more than an amount applied to the position surrounding the central part.

In each of the above constitutions, the first sealing material has opening portions at least at four corners.

In each of the above constitution, the first sealing material includes a spacer for maintaining a gap between a pair of substrates.

In each of the above constitutions, the second sealing material is exposed at the opening portions, and edges of the exposed second sealing material are curved.

In each of the above constitutions, the second sealing material is exposed at the opening portions, and edges of the exposed second sealing material are protrudes from the opening portions.

Another constitution of the manufacturing device in this invention discloses a manufacturing method of a light emitting device including a pixel portion provided with a plurality of light emitting elements having a first electrode, an organic compound layer in contact with a top portion of the first electrode, and a second electrode in contact with a top portion of the organic compound layer, between a pair of substrates, both or either of which is transparent, the manufacturing method of a light emitting device comprising the steps of:
  forming a pixel portion on one of the substrates;
  figuring a first sealing material having a bar shape on the other substrate;
  applying a plurality of drops of a second sealing material having lower viscosity than the first sealing material to a region surrounded by the first sealing material so that an amount of drops differs depending on a region to be applied to;
  filling a space between the first sealing materials facing one another, by spreading the second sealing material under pressure in the case where a pair of substrates is pasted together as the pixel region is surrounded by the first sealing material.
  curing the first sealing material and the second sealing material.

In the above constitution, the process of curing the first sealing material and the second sealing material is performed by exposure to ultraviolet radiation or by heat.

In the above constitution, a pair of substrates is divided vertically after curing the first sealing material and the second sealing material.

A pasting device according to the above manufacturing method is also one of the present invention, and a manufacturing device including a pasting device which mates a pair of substrates together with a predetermined distance therebetween, comprising:
  two substrate holders facing one another;
  means for squashing a sealing material by applying pressure to put the two substrate holders together.
  a substrate holders covered with a film containing fluoroplastics.

In the above constitution, the film comprising fluoroplastics is formed of one selected from the group consisting of: polytetrafluoroethylene, tetrafluoroethylene-hexafluoropropylene copolymer, polychlorotrifluoroethylene, tetrafluoroethylene-ethylene copolymer, polyvinyl fluoride, and polyvinylidene fluoride.

Another constitution of the manufacturing device in this invention discloses a manufacturing device including a pasting device which mates a pair of substrates together with a predetermined distance therebetween, comprising:
  two substrate holders facing one another;
  means for squashing a sealing material by applying pressure to put the two substrate holders together.
  a two-sided tape for securing substrates to the two substrate holders Further, in the above construction, the pasting device shall be provided with a light source, and in which both or either of the two substrate holders are formed of a material transparent to light. A pair of substrates is pasted together, followed by exposing a sealing material to light from the light source through one substrate holder for curing the sealing material. In addition, in the case of fixing a substrate using the two-sided tape in which adhesion is weakened by exposure to light, the sealing material can be cured by exposure to light and the two-sided tape can be peeled from the substrate holders concurrently.

Moreover, in the above constitution, the pasting device shall be provided with light source, and in which both or either of the two substrate holders are formed of a material transparent to light. Further one of the surface of the substrate holders facing a transparent one shall be a mirrored surface which reflects light. Thus, light which pass through the one of the substrate holders can pass through the pair of the substrates and can be reflected and applied to the sealing material once again.

Furthermore, in the above construction, either or both of the two substrate holders shall be provided with a heating means. A sealing material is cured by heating after a pair of substrates is pasted together. In addition, in the case of fixing a substrate using the two-sided tape in which adhesion is weakened by heating, the sealing material can be cured by heating and the two-sided tape can be peeled from the substrate holders concurrently.

An EL element includes a layer containing an organic compound wherein electro luminescence can be obtained by applying electric field thereto, an anode, and a cathode. The luminescence with an organic compound can be broadly classified into two types: one is emitted when the singlet excited state returns back to the ground state (fluorescent light) and another that is emitted when the triplet excited state returns back to the ground state (phosphorescent light). Either or both types of the luminescence can be used for a light emitting device according to the present invention.

A light emitting element (EL element) having an EL layer has a structure wherein an EL layer is sandwiched between a pair of electrodes, and an EL layer generally has a laminated structure. A laminated structure of "a hole transporting layer/a light emitting layer/an electron transporting layer" can be given as a typical structure. This structure brings extremely high luminous efficiency, so that most of the light emitting devices developed nowadays employs this structure.

Another structure in which "an anode, a hole transporting layer, a light emitting layer, and an electron transporting layer" or "an anode, a hole injecting layer, a hole transporting layer, a light emitting layer, an electron transporting layer, and an electron injecting layer" are laminated sequentially is also applicable. Fluorescent pigments may be doped to the light emitting layer. For forming these layers, either a low molecular material or a high molecular material can be used. In this specification, an EL layer shall be a generic term used to refer to all layers formed between a cathode and an anode. Therefore, each of the above-mentioned hole injecting layer, hole transporting layer, light emitting layer, electron transporting layer, and electron injecting layer shall be an EL layer.

Further, as for a light emitting device according to the present invention, a driving method for a screen display is not particularly limited and, for example, any one of a point sequential drive method, a line sequential drive method and a face sequential drive method may be used. Typically, the line sequential drive method shall be adopted and a time division gradation drive method or an area gradation drive method may appropriately be applied. A video signal to be inputted to a source line of the light emitting device may either be an analog signal or a digital signal. A driver circuit or the like may appropriately be designed in accordance with the video signal. The present invention can be applied not only to an active matrix light emitting device, but also to a passive matrix light emitting device or other types of light emitting devices.

BRIEF DESCRIPTION OF THE DRAWINGS

In the accompanying drawings:

FIGS. 3A to 3D show a top view of a substrate before and after pasting (Embodiment Mode 2);

FIGS. 9A and 9B show a structure of an active matrix EL display device (Embodiment 1);

FIGS. 10A and 10B show a structure of an active matrix EL display device (Embodiment 2);

FIGS. 11A and 11B show a top view of a substrate before and after pasting (Embodiment Mode 2);

DETAILED DESCRIPTION OF THE PREFERRED EMBODIMENTS

Embodiment Mode 1

Figure 1A:
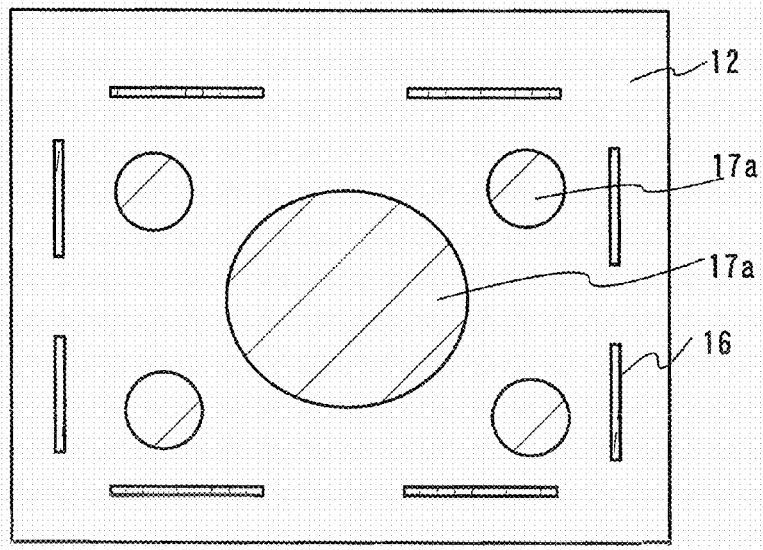
FIGS. 1A and 1B show a top view of a substrate before and after pasting (Embodiment Mode 1)

FIG. 1A shows a top view of an example of a sealing substrate (a second substrate 12) before pasting. FIG. 1A further shows an example of manufacturing a light emitting device having a pixel area from one substrate.

Eight bars of a first sealing material 16 are formed first on the second substrate 12 by using a dispenser; thereafter, a plurality of drops of a second sealing material having a lower viscosity than that of the first sealing material is applied thereon. Note that, a top view of the second substrate with the second sealing material having dripped thereon corresponds to FIG. 1A.

Figure 1B:
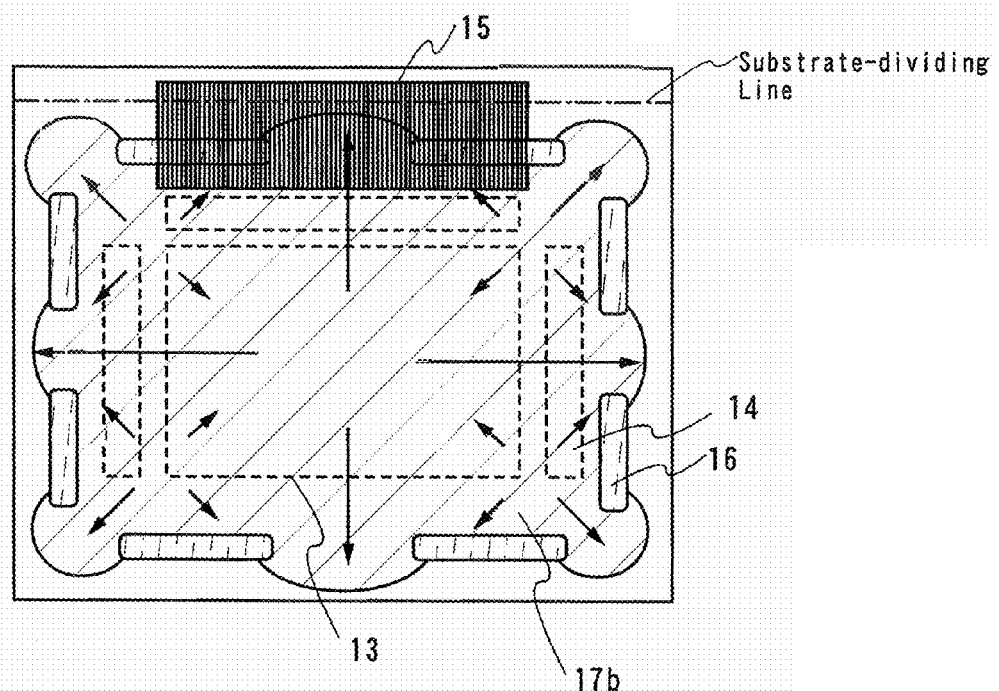

A first substrate, on which a pixel area 13 having light emitting elements, or a driver circuit portion 14, and a terminal area 15 are formed, is then pasted to the second substrate. A top view of a state immediately after pasting the pair of substrates is shown in FIG. 1B. Meanwhile, the viscosity of the first sealing material is high, so that it squeezed out very little upon pasting. The viscosity of the second sealing material is low, however, and the second sealing material spreads out planarly upon pasting, as shown in FIG. 1B. The second sealing material is squeezed out between the bars of the first sealing material 16, that is, in the direction of an arrow in FIG. 1B, toward openings. Air bubbles can thus be kept from existing in a region between the bars of the first sealing material 16, which is filled with the second sealing material. The first sealing material 16 does not mix with a second sealing material 17b, even if there is contact, and the first sealing material 16 has a viscosity with which the position where it is formed is not changed by the second sealing material 17b.

Further, the first sealing material 16 includes a spacer (filler, minute particles and/or the like) for maintaining a gap between the two substrates. Since the bars of the first sealing material 16 are symmetrically disposed, loads are applied uniformly in a balanced manner. Shocks from the outside can therefore be uniformly diffused. Each bar of the first sealing material has a symmetrical shape, and is disposed symmetrically, and therefore a very constant gap between the substrates can be maintained. The first sealing material 16 is disposed in the plane of the substrate, in parallel with an x-direction or a y-direction.

Figure 13A:
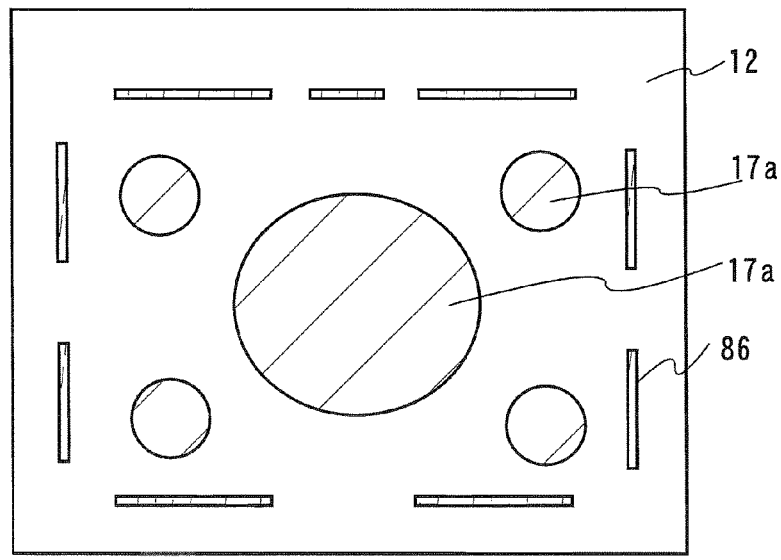
FIGS. 13A and 13B show a top view of a substrate before and after pasting (Embodiment Mode 1)
Figure 13B:
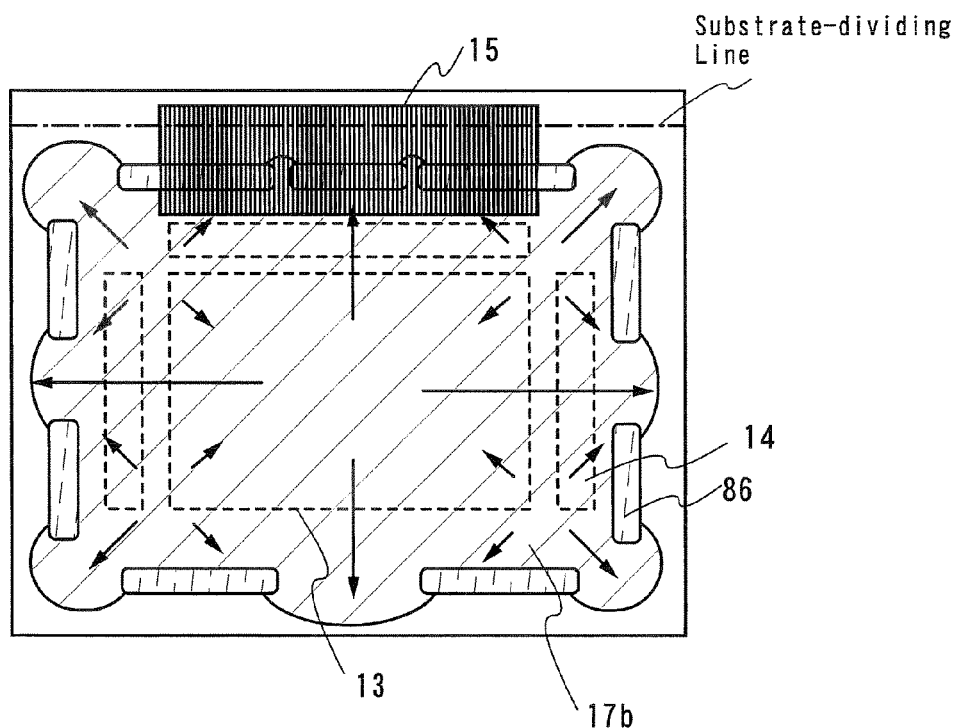
Figure 14A:
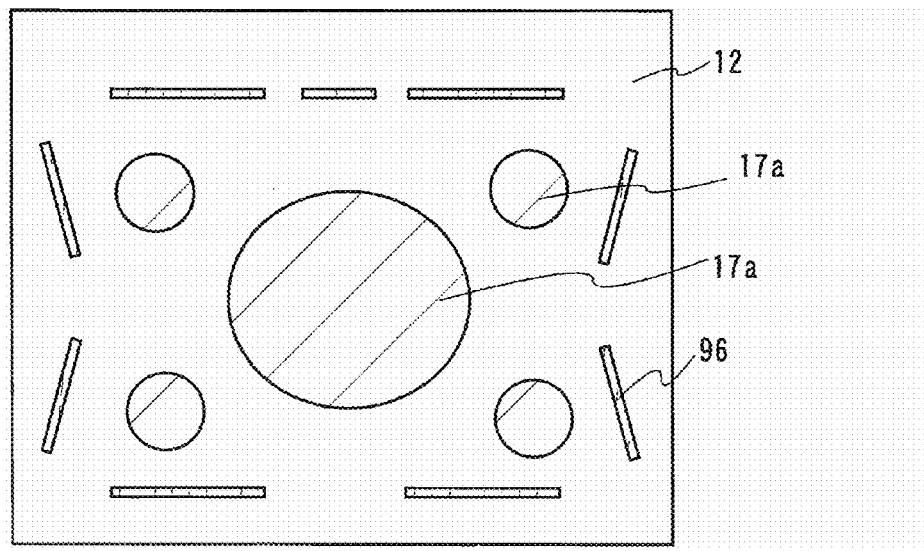
FIGS. 14A and 14B show a top view of a substrate before and after pasting (Embodiment Mode 1)
Figure 14B:
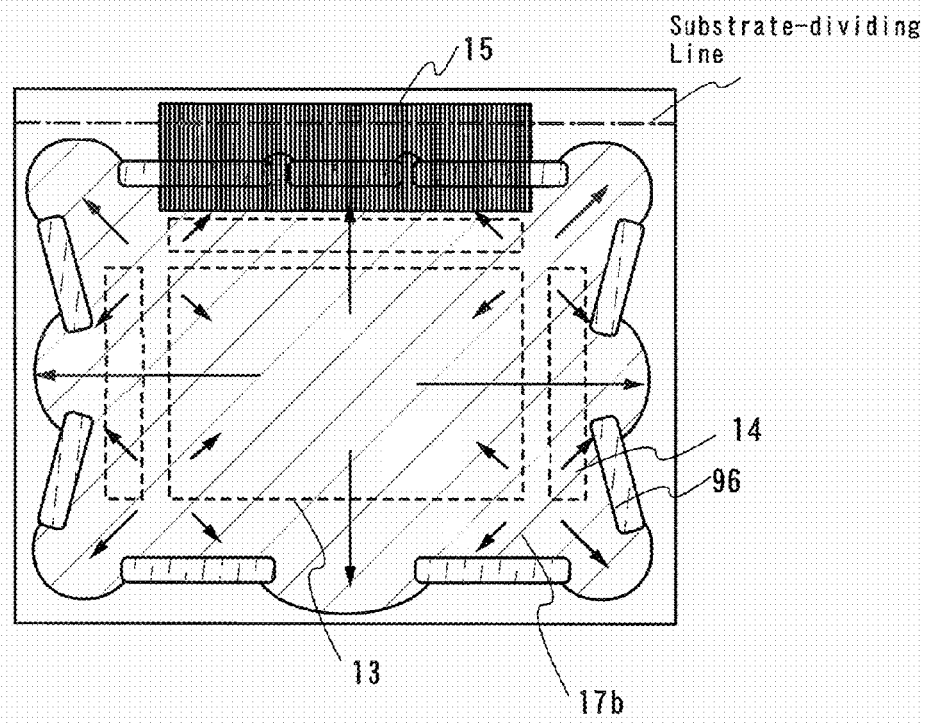

When the two substrates are pasted together, a pattern shown in FIG. 13A, in which the space between the bars of the first sealing material 86 is be narrow may be applied so as not to cover a connection port in the terminal area with a second sealing material 17a being squeezed out. A top view of the state immediately after a pair of the substrates is shown in FIG. 13B. Alternatively, a pattern shown in FIG. 14A, in which bars of a first sealing material 96 are arranged oblique to the sides of the substrate may be applied so that a second sealing material 17a is not squeezed out and is prevented from running out of the sides of the substrate. A top view of the state immediately after a pair of the substrates is pasted together is shown in FIGS. 14A and 14B. Note that, since FIGS. 13A and 13B and FIGS. 14A and 14B have almost the same structures as FIGS. 1A and 1B except for patterns of the bars of the first sealing material; like components are denoted by like numerals in FIGS. 1A and 1B.

Figure 2A:
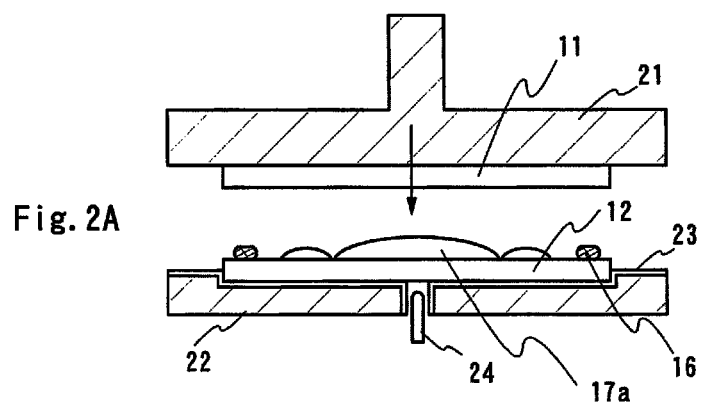
FIGS. 2A to 2C show a cross section of a manufacturing device (Embodiment Mode 1)
Figure 2B:
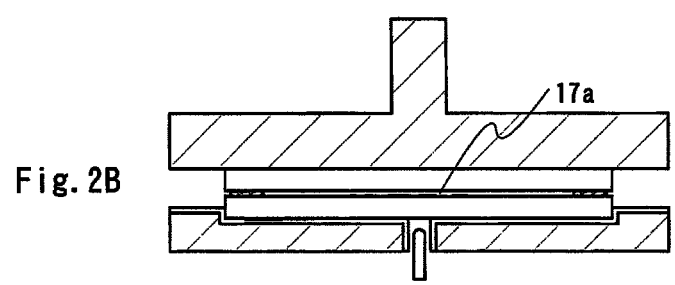
Figure 2C:
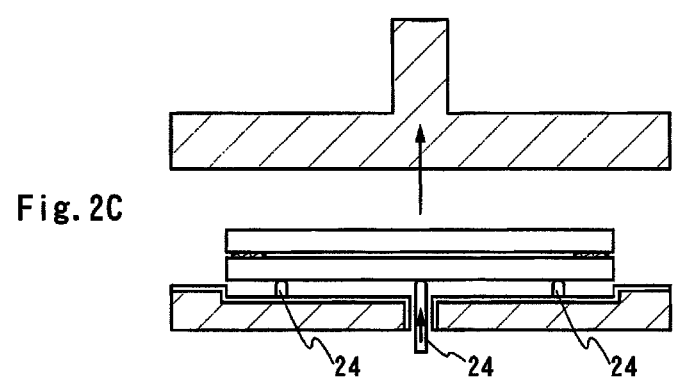

It is preferable that the substrates be pasted together by a pasting device shown in FIGS. 2A to 2C as in a manner where the second sealing member may cause no problem in spreading to the sides of the substrate.

FIGS. 2A to 2C show a cross section of a state before a pair of substrates is pasted together; FIG. 2B shows a cross section of a state immediately after pasting the substrates; and FIG. 2C shows a cross section of a state after pasting the substrates. In FIGS. 2A to 2C, reference numeral 21 denotes a first substrate holder; reference numeral 22 denotes a second substrate holder; reference numeral 23 denotes a fluoroplastic film; and reference numeral 24 denotes a lifting pin. Note that, like components in FIGS. 2A to 2C are denoted by like numerals in FIGS. 1A and 1B.

The second substrate holder in the pasting device shown in FIGS. 2A to 2C is coated with a fluoroplastic film typified by Teflon. By coating the second substrate holder with a fluoroplastic film which has little adhesion with the second sealing material, the second substrate holder can be prevented from firmly adhering with the second substrate even when the second sealing material with a low viscosity reach to the sides of the substrate or to the back of the substrate.

Note that, the second substrate holder 22 is provided with a concave portion for clipping and fixing the second substrate 12. The second substrate holder is further provided with the lifting pins 24 for removing the substrate after pasting. The first substrate holder 21 is provided with a fixing means (a fixing pin, a vacuum chuck, or the like) for fixing the first substrate. Moreover, the first substrate holder 21 or the second substrate holder 22 may be provided with a heating means for curing the sealing material.

Embodiment Mode 2

An example of manufacturing a panel from one substrate is shown in Embodiment Mode 1. Here, an example of manufacturing plural panels from one substrate will be described with reference to FIGS. 3A to 3D.

Bars of a first sealing material 32 are formed first in a predetermined location on a second substrate 31 by using a dispenser apparatus under an inert gas atmosphere. (See FIG. 3A.) A material that contains filler (diameter of 6 μm to 24 μm) and having a viscosity of 370 Pa·s is used for a translucent sealing material for the bars of the first sealing material 32. Further, the first sealing material 32 can be formed by print process because it has a simple sealing pattern.

Next, a transparent second sealing material 33 is dripped on the region surrounded by the bars of the first sealing material 32 (with openings at least in four corners) (see FIG. 3B). A highly heat resistant UV epoxy resin (product name 2500 Clear, manufactured by Electro-Lite Corporation) having a refractive index of 1.50 and viscosity of 500 cps is used here.

The first substrate, on which pixel areas 34 are formed, and the second substrate provided with the bars of the sealing material are formed, are then pasted together. (See FIG. 3C.) Note that it is preferable to perform annealing in vacuum immediately before pasting the pair of substrates together by using the sealing material, thus performing degasification. The second sealing material 33 is spread out so as to fill a space between the bars of the first sealing material 32. Due to the shape and the arrangement of the bars of the first sealing material 32, the second sealing material 33 can be made to fill the space without the introduction of air bubbles. Thereafter, ultraviolet light irradiation is performed to cure the first sealing material 32 and the second sealing material 33. Note that a heat treatment may also be performed in addition to ultraviolet irradiation.

Note that, the first substrate 35 is a plastic substrate, and plural kinds of TFTs are formed in matrix thereon, thereby forming a pixel region. The second substrate 31 is also a plastic substrate.

Subsequently, the first substrate 35 is cut by using a cutting machine such as a rotating saw (See FIG. 3D). Here, four panels are formed from one substrate.

Figure 4A:
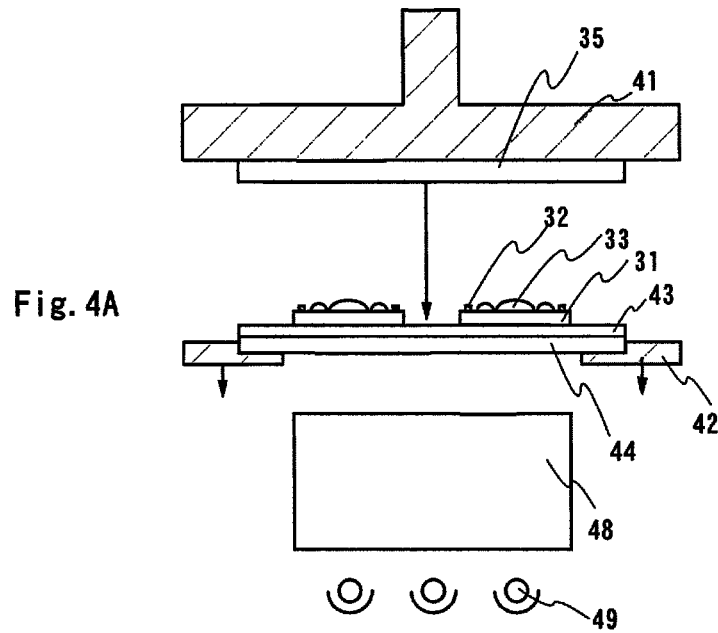
FIGS. 4A and 4B show a cross section of a manufacturing device (Embodiment Mode 2)
Figure 4B:
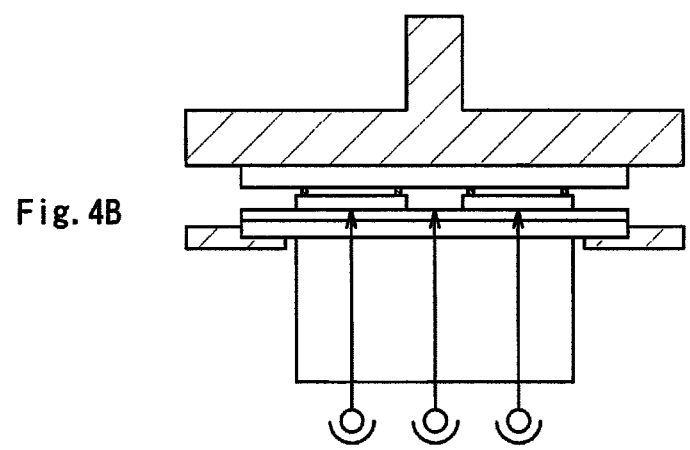

An example of a pasting device different from the one in Embodiment Mode 1 is shown in FIGS. 4A and 4B.

In FIGS. 4A and 4B, reference numeral 41 denotes a first substrate holder; reference numeral 42 denotes a second substrate holder; reference numeral 43 denotes a fluoroplastic film; reference numeral 44 denotes a support; reference numeral 48 denotes a bottom plate; and reference numeral 49 denotes a light source. Note that, the like reference numerals in FIGS. 3A to 3D are used for the corresponding parts in FIGS. 4A and 4B.

The bottom plate 48 is formed of a material transparent to light so that ultraviolet radiation emitted from the light source 49 is transmitted through thereby curing the first sealing material 32 or the second sealing material 33. A structure in which the sealing material is exposed to light transmitted through the bottom plate 48 and to the extra light reflected by the mirrored first substrate may be applied, thereby exposing the sealing material effectively. The second substrate 31 which is to serves as a sealing substrate is cut into a desired size beforehand and arranged on the support 44. Note that, a glass substrate coated with a fluoroplastic film is used here for the support 44. When the substrates are pasted together, after the first substrate holder and the second substrate holder are lowered, and the first substrate and the second substrate are pasted together by applying pressure, thereby curing the sealing material with ultraviolet radiation directly applied thereto without modification, as shown in FIGS. 4A and 4BB.

As with the pasting device shown in FIGS. 4A and 4B, since the second sealing material is coated with the fluoroplastic film, it is not adhere to the support 44 although it spreads to the side of the second substrate or to the back of the substrate.

Figure 15A:
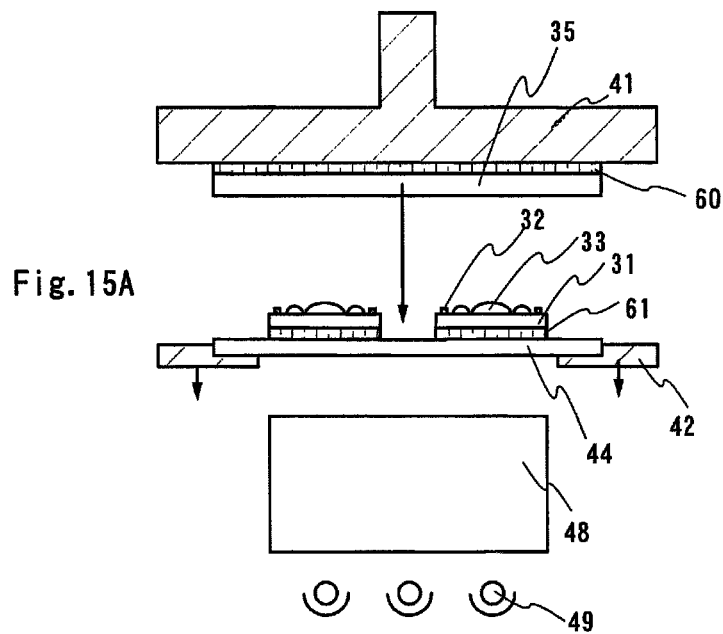
FIGS. 15A and 15B show a cross section of a manufacturing device (Embodiment Mode 2).
Figure 15B:
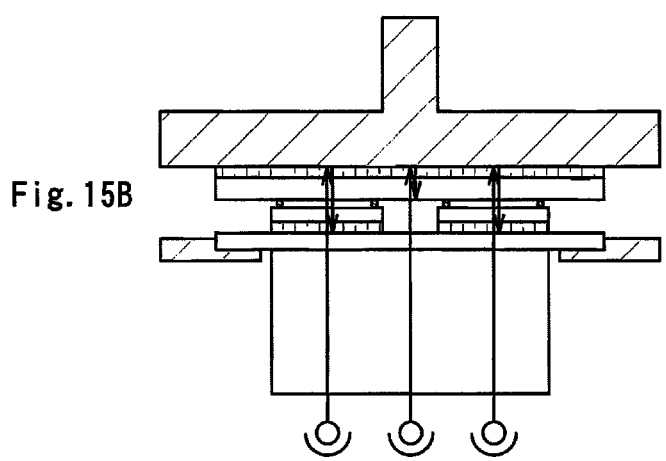

An example of a pasting device different from the one in FIGS. 4A and 4B is shown in FIGS. 15A and 15B.

In FIGS. 15A and 15B, reference numeral 41 denotes a first substrate holder; reference numeral 42 denotes a second substrate holder; reference numeral 44 denotes a support; reference numeral 48 denotes a bottom plate; reference numeral 49 denotes a light source; and reference numerals 60 and 61 denote two-sided tapes. Note that, the same reference numerals in FIGS. 4A and 4B are used for the corresponding parts in FIGS. 15A and 15B. Further, the same reference numerals in FIGS. 3A to 3D are used for the corresponding parts in FIGS. 15A and 15B.

In FIGS. 15A and 15B, the first substrate 35 is fixed to the substrate holder 41 with the two-sided tape 60. The second substrate is fixed to the support 44 with the two-sided tape 61. The two-sided tapes 60 and 61 with adhesion force which is deteriorated by ultraviolet radiation, or the ones with adhesion force which is deteriorated by heat may be used. After the first substrate holder and the second substrate holder are lowered, the substrate 35 and the substrate 31 are pasted together with the two-sided tapes 60 and 61 by applying pressure. The sealing material is cured by being exposed to ultraviolet radiation without modification. When a tape with adhesion force which is deteriorated by ultraviolet radiation is used, the adhesion force can be deteriorated; after the pasting process, the panels can be removed easily from the substrate holder, and further, the two-sided tapes can be peeled off from the panels.

This embodiment mode can be combined freely with Embodiment Mode 1.

The present invention using the above described structure will be described more precisely with embodiments below.

EMBODIMENTS

Embodiment 1

In this embodiment, an example of pasting a separated layer formed over a glass substrate by transfer on a plastic substrate is shown in FIGS. 5A to 5J.

Here, a separation method using a metal film and a silicon oxide film is applied.

First, an element is formed on a glass substrate (a first substrate 300). In this embodiment, AN100 is used for the glass substrate. A metal film 301a, which is a tungsten film (having a thickness ranging from 10 nm to 200 nm, preferably, from 50 nm to 75 nm) here, is formed on the glass substrate by sputtering, and an oxide film 302, which is a silicon oxide film (having a thickness ranging from 150 nm to 200 nm) here, is laminated thereon without exposing to the air. The film thickness of the oxide film 32 shall preferably be twice or more than that of the metal film. Note that, while a lamination is formed, an amorphous oxide metal film (an oxide tungsten film) with a thickness ranging approximately from 2 nm to 5 nm is formed between the metal film 301a and the silicon oxide film 302. In the occasion of a separation process thereafter, separation occurs in the oxide tungsten film, or at an interface between the tungsten film and the oxide film, or an interface between the oxide tungsten film and a tungsten film.

In place of Tungsten (W), an element selected from a group consisting of Molybdenum (Mo), WN, TiN, and TiW, or an alloy or a compound thereof may be formed into a single layer or into a lamination thereof.

The tungsten film and the silicon oxide film are formed over an edge portion and a side of the substrate in sputtering. It is preferable that the deposited tungsten film, the oxide tungsten film, and the silicon oxide film be removed selectively by $O_2$ ashing.

Next, a silicon oxynitride film as a base insulating film (with a thickness of 100 nm) is formed by PCVD, and an amorphous silicon film (with a thickness of 54 nm) containing hydrogen is laminated thereon without exposing to the air. Note that, the silicon oxynitride film is a blocking layer which prevents impurities such as alkali metal from defusing out of a glass substrate.

A hydrogen concentration of the amorphous silicon film containing hydrogen was measured by FT-IR. As a result, Si—H was $1.06 \times 10^{22}$ (atoms/cm$^3$), Si—H$_2$ was $8.34 \times 10^{19}$ (atoms/cm$^3$), and the calculated hydrogen concentration in the composition ratio was 21.5%. Further, the hydrogen concentration was similarly calculated under the changed film deposition conditions with PCVD; results of the obtained hydrogen concentrations in the composition ratio were 16.4%, 17.1%, and 19.0%.

Thereafter, the amorphous silicon film is crystallized by using known technique (solid-phase growth, laser crystallization, crystallization using catalyst metal, or the like), and an element using a TFT having a polysilicon film as an active layer is formed. In this embodiment, a polysilicon film is obtained by crystallization using a catalyst metal. A nickel acetate salt solution containing nickel of 10 ppm by weight is coated by a spinner. Nickel elements can be applied on the entire surface by sputtering instead of spin coating. Then, a heat treatment is carried out to crystallize and form a semiconductor film having a crystal structure (here, a polysilicon layer). In this embodiment, a silicon film having a crystal structure is obtained by a heat treatment for crystallization (at 550° C. for 4 hours) after another heat treatment (at 550° C. for one hour).

Figure 6A:
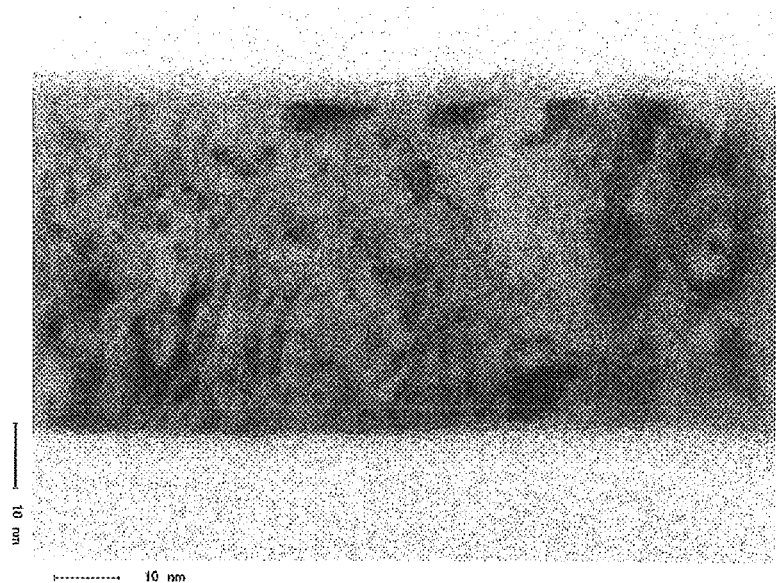
FIGS. 6A and 6B show a cross-sectional TEM picture of the substrate before the separation (Embodiment 1)
Figure 6B:
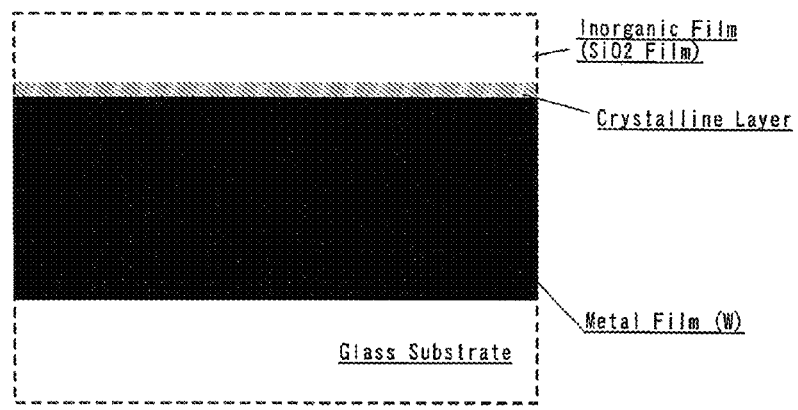

The amorphous silicon film contains hydrogen. In the case of forming a polysilicon film by heating, a heat treatment at least at 410° C. is performed thereby diffusing hydrogen as well as forming the polysilicon film. An amorphous oxide metal film is crystallized by a heat treatment at least at 400° C. As a result, a metal oxide film 301b having a crystal structure can be obtained. FIGS. 6A and 6B show a cross-sectional TEM picture. An oxide film having a crystalline structure is formed accordingly and hydrogen is diffused by performing a heat treatment at least at 4100C. After the heat treatment at least at 410° C. is finished, the separation in the oxide tungsten film, or at an interface between the oxide tungsten film and the oxide silicon film, or an interface between the oxide tungsten film and the tungsten film can be achieved with relatively little force (For example, human hands, wind pressure of gas blown from a nozzle, or ultrasonic waves, or the like). Note that, when a heat treatment is performed at a temperature at which an oxide metal film having a crystal structure can be obtained, a thickness of the oxide metal film is thinned to some extent.

Various elements typified by a TFT (a thin film diode, a silicon-based pin-junction photoelectric transducer, a silicon resistance element, a sensor device (typically, a pressure-sensitive fingerprints sensor using polysilicon)) can be formed by using the obtained polysilicon film. In addition, the present invention can be applied to an element having a TFT that uses an amorphous silicon film as an active layer.

Next, after the oxide film on the surface of the silicon film having a crystal structure is removed by dilute hydrofluoric acid or the like, irradiation of laser light (XeCl: wavelength of 308 nm) for raising a crystallization rate and repairing defects remained in crystal grains is performed in the atmosphere or in an oxygen atmosphere. Excimer laser light with a wavelength of 400 nm or less, or second harmonic wave or third harmonic wave of a YAG laser is used for the laser light. Here, pulsed laser light with a repetition frequency of approximately 10 to 1000 Hz is used, the pulsed laser light is condensed to 100 to 500 mJ/cm$^2$ by an optical system, and irradiation is performed with an overlap ratio of 90 to 95%, whereby the silicon film surface may be scanned. Here, the irradiation of the laser light is performed in the atmosphere with a repetition frequency of 30 Hz and energy density of 470 mJ/cm$^2$. Note that an oxide film is formed on the surface by the laser light irradiation since the irradiation is conducted in the atmosphere or in an oxygen atmosphere. Though an example of using the pulsed laser is shown here, the continuous oscillation laser may also be used. When crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd: YVO$_4$ laser (basic wave of 1064 nm) is applied. Specifically, laser light emitted from the continuous oscillation type YVO$_4$ laser with 10 W output is converted into harmonics by using a non-linear optical elements. Also, a method of emitting harmonics by applying crystal of YVO$_4$ and the non-linear optical elements into a resonator can be given. Then, more preferably, the laser beams are formed so as to have a rectangular shape or an elliptical shape by an optical system, thereby irradiating a substance to be treated. At this time, the energy density of approximately 0.01 to 100 MW/cm$^2$ (preferably 0.1 to 10 MW/cm$^2$) is required. The semiconductor film is moved at approximately 10 to 2000 cm/s rate relatively corresponding to the laser beams so as to irradiate the semiconductor film.

The oxide film formed by this laser light irradiation and an oxide film formed by treating the surface with ozone water for 120 seconds together make a barrier layer that has a thickness of 1 to 5 nm in total. The barrier film is formed in order to remove nickel that is added for crystallization from the film. Though the barrier layer is formed by using ozone water here, another method such as ultraviolet irradiation performing in an oxygen atmosphere or oxygen plasma treatment to oxidize the surface of the semiconductor film having the crystal structure may be used. In addition, as another method for forming the barrier layer, an oxide film having a thickness of about 1 nm to 10 nm may be deposited by plasma CVD, sputtering, evaporation, or the like. Further, before forming the barrier layer, the oxide film formed by laser light irradiation may be removed.

On the barrier layer, an amorphous silicon film containing argon elements are formed to a thickness of 10 nm to 400 nm, in this embodiment, 100 nm by sputtering to serve as a gettering site. In this embodiment, an amorphous silicon film containing an argon element is formed under an atmosphere containing argon with using a silicon target. When plasma CVD is used for forming an amorphous silicon film containing argon element, it is formed under conditions where a flow ratio of monosilane to an argon is controlled to be 1/99; a pressure during deposition to be 6.665 Pa (0.05 Torr); a RF power density during deposition to be 0.087 W/cm$^2$; a deposition temperature to be 350° C.

Thereafter, a furnace heated at 650° C. is used for a heat treatment for 3 minutes for gettering to reduce the nickel concentration in the semiconductor film having a crystal structure. A lamp annealing apparatus may be used instead of the furnace.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Note that, in the case where crystallization is not performed using a catalytic element, the above described processes such as the formation of a barrier layer, the formation of a gettering site, a heat treatment for gettering, the removal of a gettering site, or the removal of a barrier layer are not necessary.

Then, after a thin oxide film is formed from ozone water on the surface of the obtained silicon film having a crystal structure (also referred to as polysilicon film), a mask made of resist is formed, and an etching process is conducted thereto to obtain a desired shape, thereby forming the island-like semiconductor layers separated from one another. After the formation of the semiconductor layers, the mask made of resist is removed.

Next, the oxide film is removed with the etchant containing hydrofluoric acid, and at the same time, the surface of the silicon film is washed. Thereafter, an insulating film containing silicon as its main components, which serves as a gate insulating film, is formed. In this embodiment, a silicon oxynitride film (composition ratio: Si=32%, O=59%, N=7%, H=2%) is formed to have a thickness of 115 nm by PCVD.

Thereafter, gate electrodes are formed over a gate insulating film; the formation of a source region or a drain region attained by doping to the active layer, the formation of an interlayer insulating film, the formation of a source electrode or a gate electrode, an activation treatment, and/or the like is/are performed appropriately, and thereby fabricating a top gate TFT 303 which has a polysilicon film as an active layer. Note that, FIG. 5A to 5J shows a TFT for current control in the pixel region alone; however, a switching TFT or a driver circuit for driving the pixel region are also formed on the same substrate.

Next, a film containing an organic compound (hereinafter, organic compound layer) is interposed between a pair of electrodes (an anode and a cathode). Then, a first electrode for forming a light emitting device that can achieve fluorescence or phosphorescence by applying electric field to the pair of electrodes is formed. Here, the first electrode 304 that can serve as an anode or a cathode is formed of a large work function metal film (Cr, Pt, W, or the like), or a transparent conductive film (Indium tin oxide alloy (ITO), indium oxide zinc oxide alloy (In$_2$O$_3$—ZnO), zinc oxide (ZnO), or the like). An example of forming the first electrode 304 for serving as an anode is described.

In case that the source electrode or the drain electrode of a TFT serves as a first electrode, or a first electrode in contact with the source region or a drain region is formed separately, the TFT includes the first electrode.

A bank 305a is formed on each end of the first electrode (anode) as encircling the periphery of the first electrode. To improve coverage, the upper edge portion or the bottom edge portion of the bank is formed to have a curved surface having curvature. For example, in the case that a positive type photosensitive acrylic is used as a material for the bank, it is preferable that only the upper edge portion of the bank is formed to have a curved surface having radius of curvature (from 0.2 to 3 µm). Either a negative type that is an insoluble material in etchant according to light to which photosensitive material is exposed or a positive type that is dissoluble in etchant according to light can be used as the bank 305a.

Figure 5A:
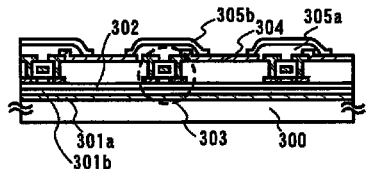
FIGS. 5A to 5J show a manufacturing process (Embodiment 1)

Further, in the case of laminating a plurality of organic resins, there is a threat that a part of the plural organic resins is melted, or the plural organic resin is too adhesive, during application or baking. Therefore, in the case of using organic resin as a material for the bank, the bank 305a is preferable to be covered by an inorganic insulating film (a $SiN_x$ film, a $SiN_xO_y$ film, an $AlN_x$ film, or an $AlN_xO_y$ film) in order to make it easy to remove water-soluble resin after coating it over the whole surface in the following process. The inorganic insulating film serves as a part of the bank 305b (FIG. 5A).

Figure 5B:
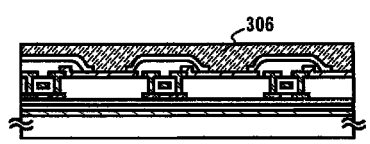

Next, an adhesive that is soluble in water or alcohol is coated over the whole surface and baked. The adhesive may be composed of, for example, epoxy series, acrylate series, silicon series, or the like. Here, a film formed of water-soluble resin (TOAGOSEI Co., Ltd.: VL-WSHL10) 306 is spin-coated to have a thickness of 30 µm, and exposed for two minutes to be partially cured, then, exposed its back to UV rays for 2.5 minutes, and then, exposed its surface for 10 minutes to be fully cured (FIG. 5B). The water-soluble resin film serves as a leveling film, which thereafter mates substrates together so a surface of the leveling film and the substrate surface are placed in parallel. Unevenness might generates resulting from an electrode or from a TFT when the water-soluble resin film is not used, in pressure bonding.

The adhesion of the metal film 301a and the metal oxide film 301b, or the adhesion of the metal oxide film 301b and an oxide film 302 is partly weakened for easy separation. The treatment for partly wakening the adhesion is carried out by applying laser light to the metal film 301b along the region that is to be separated, or damaging the inside or a part of the interface of the metal oxide film 301b by applying pressure locally from outside along to the region that is to be separated. Specifically, a hard needle such as a diamond pen may be attached perpendicular to the region to be separated, and moved along with the periphery thereof by applying loading. Preferably, a scriber device can be used to move with applying loading on the region with press force ranging from 0.1 to 2 mm. It is important to carry out some processes for easy separation, that is, prepare for the separation process. Such preparatory process for weakening selectively (partly) the adhesion will prevent poor separation and improve process yield.

Figure 5C:
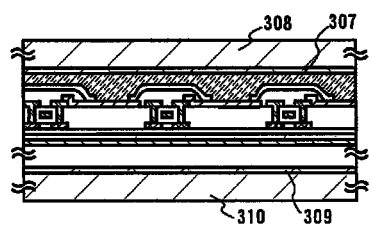

Next, a second substrate 308 is pasted to a film 306 formed of water-soluble resin with a two-sided tape 307. Then, a third substrate 310 is pasted to the first substrate 300 with a two-sided tape 309 (FIG. 5C). The third substrate 310 prevents the first substrate 300 from damaging in the following separation process. For the second substrate 308 and the third substrate 310, the substrate that has higher rigidity than that of the first substrate 300, for example, a quartz substrate or a semiconductor substrate, is preferably to be used. Note that, an adhesive such as an adhesive which is separated by being exposed to ultraviolet radiation may be used instead of a two-sided tape.

Figure 5D:
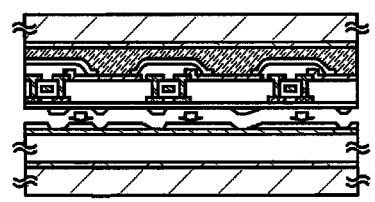
Figure 7A:
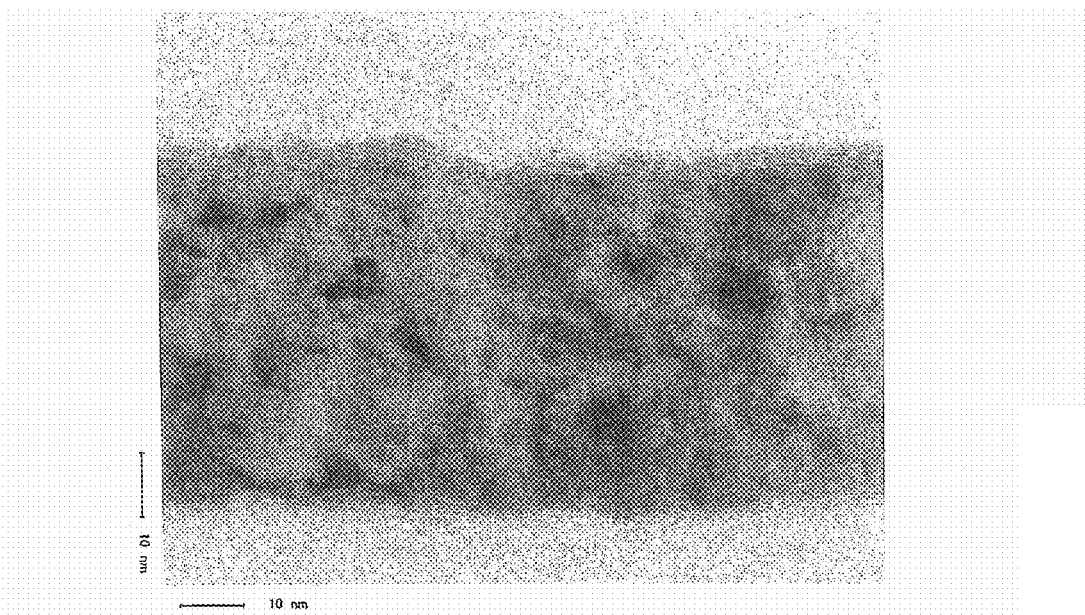
FIGS. 7A and 7B show a cross-sectional TEM picture of the substrate after the separation (Embodiment 1)
Figure 7B:
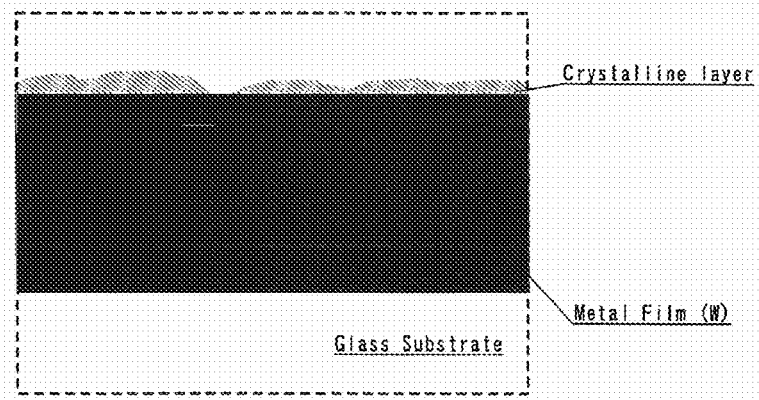

The first substrate 300 provided with the metal film 301a is separated from the region, which is partly weakened its adhesiveness by a physical means. The first substrate 300 can be separated by comparatively small force (for example, man's hand, air pressure of gas sprayed from a nozzle, ultrasonic waves, or the like). Thus, a layer to be separated formed on the silicon oxide layer 302 can be separated from the first electrode 300. FIG. 5D shows a state after the separation process. Note that, FIGS. 7A and 7B show a cross-sectional TEM picture of the first substrate 300 which has undergone the separation. The TEM pictures in FIGS. 7A and 7B and FIGS. 6A and 6B show different parts and they do not correspond to each other. As shown in FIGS. 7A and 7B, the oxide tungsten film is partly thin and partly nonexistent. The tungsten oxide film partly remains in the separated layer; however, the tungsten film is transparent, so that the film may not be necessarily removed. In this embodiment, the film is removed.

By applying the separation method described above, a TFT having high electric characteristics (typified by field effect mobility) can be transferred to a plastic substrate without change.

Figure 5E:
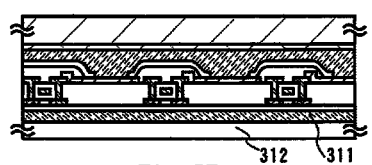

Next, a fourth substrate 312 is pasted to the oxide layer 302 (and the separated layer) with an adhesive 311 (FIG. 5E). It is important that the adhesion of the fourth substrate 312 and the oxide layer 302 (and the separated layer) is stronger than that of the second substrate 308 and the separated layer by the two-sided tape 307.

A plastic substrate (ARTON made of norbornene resin with a polar group, manufactured by JSR) is used for the fourth substrate 312. The plastic substrate can be formed of at least one selected from the group consisting of: polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyallylate (PAR), polybutylene terephthalate (PBT), and polyimide.

As the adhesive 311, various types of curing adhesive, for example, a photo-curing adhesive such as a reaction-curing adhesive, a heat-curing adhesive, a UV-curing adhesive, or the like, or an anaerobic adhesive is utilized.

Figure 5F:
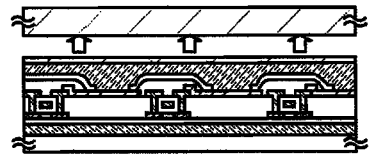

The second substrate 308 is separated from the two-sided tape 307 (FIG. 5F).

Figure 5G:
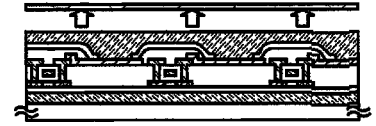

Then, the two-sided tape 307 is removed (FIG. 5G).

Figure 5H:
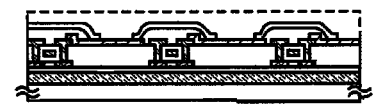

And then, the water-soluble resin 306 is melted with water and removed (FIG. 5H). If residue of the water-soluble resin is left on the first electrode 304, it will cause the deterioration of the device. Consequently, it is preferable that the surface of the first electrode 304 be rinsed or treated in $O_2$ plasma.

If it is necessary, the surface of the first electrode 304 is rubbed and washed by using a porous sponge (typically, a sponge of PVA (polyvinyl alcohol) or nylon) soaked in a surfactant (weak alkaline).

Immediately prior to forming a layer 313 containing an organic compound, the substrate is heated in a vacuum for removing absorbed moisture in the whole substrate that is provided with a TFT and a bank. Moreover, the first electrode may be exposed to ultraviolet radiation immediately prior to forming the layer 313 containing the organic compound.

The layer 313 containing the organic compound is formed selectively over the first electrode (anode) by vapor deposition using an evaporation mask or ink-jetting. As the layer 313 containing the organic compound, a polymer material, a low molecular material, an inorganic material, a mixed layer formed of the above materials, a layer formed by dispersing above materials, or a lamination layer formed by stacking appropriate combination of the above materials can be used.

Figure 5I:
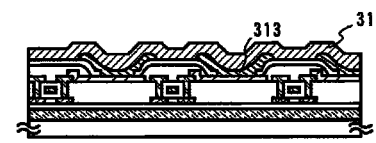

A second electrode (cathode) 314 is formed on the layer containing the organic compound 303 (FIG. 5I). For forming the cathode 314, a lamination layer of a thin film, which has a thickness of being transparent to light, formed of a small work function material (Al, Ag, Li, Ca, or alloy of these materials such as MgAg, MgIn, AlLi, $CaF_2$, or CaN) and a transparent conductive film is utilized. If necessary, a protective layer is formed for covering the second electrode by sputtering or vapor deposition. The transparent protective lamination layer may be formed of a silicon nitride film, silicon oxide film, a silicon nitride oxide film (SiNO film: a ratio of N to O composition is N>O)), or silicon oxynitride (SiON film: a ratio of N to O composition is N<O), or a thin film containing carbon as its main component (for example, DLC film, or CN film), formed by sputtering or CVD.

A sealing material (not shown) containing a spacer for maintaining a gap between a pair of substrates is applied to a fifth substrate 314 that serves as a sealing member in a pattern of the first sealing material shown in FIG. 1. The fifth substrate may be transparent to light in this embodiment since an example of the light emitting element in which light generated therein emit through the fifth substrate 314 is described. Here, the same plastic substrate (ARTON: JSR) as the fourth substrate is used to prevent a warp by conforming the thermal expansion coefficient. ARTON substrate is suitable for a fifth substrate since it is hardly birefringent and has a low water absorption rate. When a plastic substrate is used, it is preferable that a pretreatment (ethanol wiping, UV radiation, $O_2$ plasma treatment or the like) for improving the adhesion between the plastic substrate and the first sealing material before a pattern of the first sealing material is aligned.

Figure 5J:
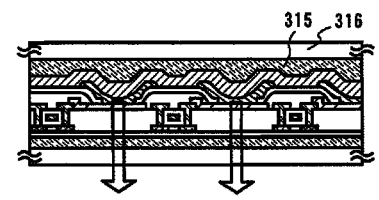

Thereafter, a few drops of sealing material with a low viscosity are applied to paste the sealing substrate and an active matrix substrate without air bubbles mixed into using a pasting device shown in FIGS. 2A to 2C or FIGS. 4A and 4B. The pasting device shown in FIGS. 2A to 2C and FIGS. 4A and 4B are of use particularly when a pair of plastic substrates is mated together. Moreover, applying a few drops of the sealing material with a low viscosity is also of use for pasting a pair of substrates together. With this pasting process, sealing is performed in a manner where a light emitting region provided on an active matrix substrate is surrounded by sealing patterns provided on a sealing substrate. Further, sealing is performed in a manner where a space surrounded by the sealing material is filled with an adhesive 315 formed from a transparent organic resin (FIG. 5J).

Figure 8:
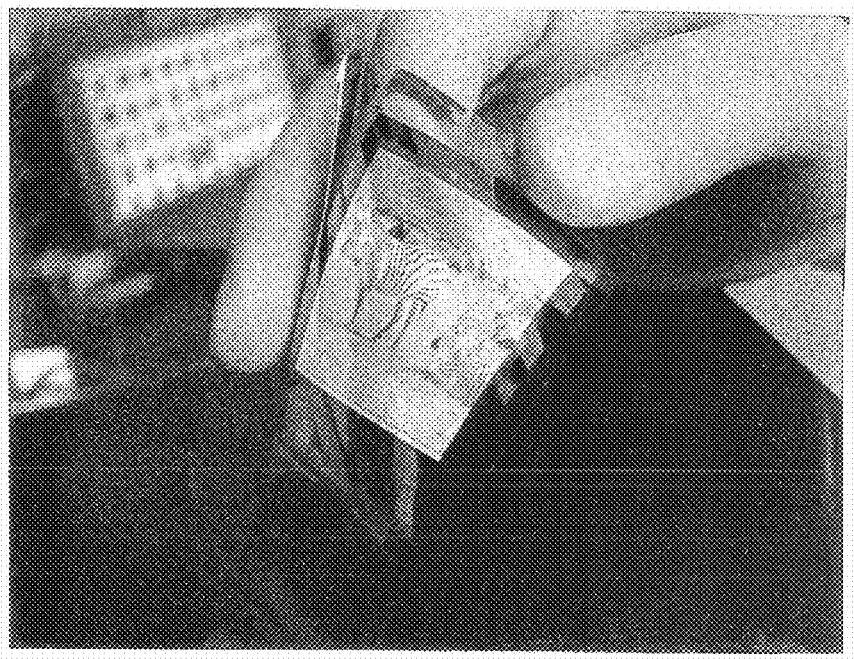
FIG. 8 shows a picture of a displaying panel (Embodiment 1)

In the above step, a light emitting device provided with a TFT and a light emitting element can be manufactured with plastic substrates 312 and 314 serving as holders. Since the holders are plastic substrates, the light emitting device can be thin, lightweight, and flexible. FIG. 8 shows an active matrix light emitting device displaying images while it is folded with human fingers. The light emitting device shown in FIG. 8 is manufactured according to this embodiment.

Here, an example of a light emitting device having a bottom emission structure is shown in FIGS. 9A and 9B.

Note that, FIG. 9A is a top view of the light emitting device and FIG. 9B is a cross-sectional view of FIG. 9A taken along the line A-A'. Reference numeral 1201 indicated by the dotted line denotes a source signal line driver circuit; 1202 denotes a pixel area; and 1203 denotes a gate signal line driver circuit. Further, reference numeral 1204 is a plastic substrate (ARTON); 1205 is a sealing material containing a spacer for maintaining a gap between a pair of substrates; and an inside area surrounded by the sealing material 1205 is filled with a sealing material 1207.

Note that, reference numeral 1208 denotes a wiring for transmitting signals inputted to the source signal line driver circuit 1201 and the gate signal line driver circuit 1203, and the wiring receives video signals and clock signals form an FPC (flexible printed circuit) 1209 serving as an external input port.

Next, a cross-sectional structure will be explained with reference to FIG. 9B. A driver circuit and a pixel area are formed over a substrate 1210 having transparency with an adhesive 1240 therebetween, but the source signal line driver circuit 1201 as the driver circuit and the pixel area 1202 are shown in FIG. 9B. The source signal line driver circuit 1201 is formed of a CMOS circuit that is a combination of an n-channel TFT 1223 and a p-channel TFT 1224.

The pixel area 1202 is formed from a plurality of pixels each of which includes a switching TFT 1211, a current controlling TFT 1212, and a first electrode (anode) 1213 formed of a transparent conductive film that is electrically connected to a drain of the current controlling TFT 1212.

In this embodiment, the first electrode 1213 is formed so that a part of which is to be overlapped with a connecting electrode so as to be electrically connected to a drain region of the TFT via the connecting electrode. It is preferable that the first electrode 1213 be formed of a conductive film that has transparency and a large work function (for example, an indium tin oxide alloy (ITO), an indium oxide-zinc oxide alloy ($In_2O_3$—ZnO), zinc oxide (ZnO), or the like).

An insulator 1214 (referred to as a bank, or the like) is formed to cover the edge portion of the first electrode (anode) 1213. To improve coverage, the upper edge portion or the lower edge portion of the insulating substance 1214b is formed to have a curved surface having a curvature. In addition, the insulator 1214 may be covered with a protective film formed of an aluminum nitride film, an aluminum nitride oxide film, a thin film containing carbon as its main components, or a silicon nitride film.

An organic compound layer 1215 is selectively formed over the first electrode (anode) 1213 by vapor deposition using an evaporation mask or ink-jetting. Further, a second electrode (cathode) 1216 is formed over the organic compound layer 1215. As a material for forming the cathode, a small work function material (for example Al, Ag, Li, Ca, alloys thereof, that is, MgAg, MgIn, AlLi, $CaF_2$, or CaN) may be used. Thus, a light emitting device 1218 comprising the first electrode (anode) 1213, the organic compound layer 1215, and the second electrode (cathode) 1216, is fabricated. The light emitting device 1218 emits light in the direction indicated by an arrow in FIG. 9B. The light emitting device 1218 in this embodiment is a type of the one which can achieve monochrome emission of R, G, or B. Full color emission can be achieved by the light emitting device in which each organic compound layer that can achieve R, G, and B emission is formed selectively.

Further, a protective layer 1217 is formed in order to seal the light emitting element 1218. The transparent protective layer 1217 may be preferably formed of an insulating film containing silicon nitride or silicon nitride oxide as it main components, which is formed by sputtering (DC type of RF type) or PCVD, a thin film containing carbon as its main component (for example, DLC film, or CN film), or a lamination layer comprising the above. A silicon nitride film having high blocking effects against impurities such as moisture, alkali metals, or the like can be obtained by using a silicon target under an atmosphere comprising nitrogen and argon. A silicon nitride target may be utilized instead of using a silicon target. In addition, the transparent protective film can be formed by a film formation system that uses remote plasma.

Further, in order to seal the light emitting element 1218, the plastic substrate 1204 is pasted to the substrate by the first sealing material 1205 and the second sealing material 1207 under an inert gas atmosphere. It is preferable to use an epoxy resin with high viscosity comprising filler as a material for the first sealing material 1205. The second sealing material is preferably formed from an epoxy resin having a low viscosity as well as high transparency. It is also preferable that the sealing material 1025 and 1207 inhibit transmission of moisture or oxygen as possible.

Further that, a substrate 1210 is a plastic substrate (ARTON) pasted after the formation of a TFT. Note that, a substrate to which the substrate 1210 is to be pasted is separated according to the above separation method.

Here, the separation is carried out in the vicinity of an interface of the oxide tungsten film; however, it is not limited to such a method. For example, the separation may be achieved by laser irradiation after an amorphous silicon film containing hydrogen is formed over a first substrate, or a first substrate may be removed by etching or by machine.

Further, this embodiment can freely be combined with Embodiment Mode 1 or Embodiment Mode 2

Embodiment 2

In Embodiment 1, an example of pasting a plastic substrate is shown; however, the present invention can be applied to other types of substrate pasting. In this embodiment, an example of manufacturing a light emitting device (top emission structure) provided with a light emitting element having an organic compound layer as a light emitting layer is shown in FIGS. 10A and 10B.

The conventional light emitting device has a structure that has a light emitting element in which an electrode on a substrate is formed as an anode, an organic compound layer is formed on the anode, and a cathode is formed on the organic compound layer, and light generated in the organic compound layer is emitted through the anode formed as a transparent electrode to a TFT (hereafter, the structure is referred to as a bottom emission).

Although an encapsulating can is possible to cover a light emitting element in the above bottom emission structure, the structure in which an electrode on a substrate is formed as an anode, an organic compound layer is formed on the anode, and a cathode as a transparent electrode is formed over an organic compound layer (hereinafter, the structure is referred to as a top emission structure) cannot use the encapsulating can that is made from a light shielding material. A desiccant on the pixel area disturbs the display in the top emission structure. Further, in order not to absorb moisture, the desiccant requires careful handling and quick enclosing.

Compared to a bottom emission structure, a top emission structure requires few material layers through which light generated in an organic compound layer is transmitted, and thereby suppresses stray light between material layers having different reflective index.

In this embodiment, the glass substrate 1104 and the glass substrate 1110 are pasted together by the pasting method and pasting device according to Embodiment Mode 1 or Embodiment Mode 2.

FIG. 10A is a top view of a light emitting device. FIG. 10B is a cross-sectional view of FIG. 10A taken along the line of A-A'. Reference numeral 1101 denoted by a dotted line denotes a source signal line driver circuit; 1102 denotes a pixel area; 1103, a gate signal line driver circuit; 1104, a transparent sealing substrate; and 1105, a first sealing material. Space encircled by the first sealing material 1105 is filled with a transparent second sealing material 1107. In addition, the first sealing material 1105 contains a spacer for maintaining a gap between substrates.

Further, reference numeral 1108 denotes a wiring for transmitting signals inputted to the source signal line driver circuit 1101 and the gate signal line driver circuit 1103. The wiring 1108 receives a video signal or clock signal from a FPC (flexible printed circuit) 1109 that serves as an external input terminal. Although only FPC is illustrated, a printed wiring board (PWB) may be attached to the FPC.

The cross-sectional structure will be described with reference to FIG. 10B. A driver circuit and a pixel region are formed over a glass substrate 1110 with a laminated film 1150 and an adhesive 1140 therebetween. A source signal driver circuit 1101 as a driver circuit and a pixel region 1102 are shown here.

In the source signal line driver circuit 1101 is formed from a CMOS circuit in which an n-channel TFT 1123 and a p-channel TFT 1124 are combined. Note that, such TFTs can also be obtained according to Embodiment 1. The TFTs which form the driver circuit may be formed by at least one circuit selected from the group consisting of: a CMOS circuit, a PMOS circuit and an NMOS circuit which are known in the art. In the present embodiment, a driver-integrated type in which the driver circuit is formed over the substrate is shown, but the driver-integrated type may not necessarily be adopted. The driver circuit can also be formed outside instead of being formed over the substrate. A constitution of the TFT using a polysilicon film as an active layer is not particularly limited thereto, either a top gate type TFT or a bottom gate type TFT is permissible.

The pixel area 1102 is formed by a plurality of pixels each of which comprises a switching TFT 1111, a current-controlling TFT 1112 and a first electrode (anode) 1113 which is electrically connected to the drain of the current-controlling TFT 1112. The current-controlling TFT 1112 may either be an n-channel type TFT or a p-channel type TFT, but when it is to be connected to the anode, it is preferably be a p-channel type TFT. It is also preferable that a storage capacitor (not shown) is appropriately provided. An example in which only a cross-sectional constitution of one pixel is shown where two TFTs are used in the pixel is illustrated, but three or more TFTs may appropriately be used per pixel.

Since it is constituted such that the first electrode 1113 is directly connected to the drain of the TFT 1112, it is preferable that a lower layer of the first electrode 1113 be a material layer which can have an ohmic contact with the drain comprising silicon, while an uppermost layer thereof which contacts a layer containing an organic compound is allowed to be a material layer which has a large work function. For example, a three-layer constitution which includes a titanium nitride film, a film containing aluminum as a main component, and a titanium nitride film, can have a low resistance of wiring, a favorable ohmic contact, and also, can function as an anode. Further, as the first electrode 1113, a single layer of at least one film selected from the group consisting of: a titanium nitride film, a chromium film, a tungsten film, a zinc film, a platinum film and the like, or a laminate of three layers or more may be used.

An insulating substance 1114 (referred to as a bank, a partition, a barrier, a mound or the like) is formed over each end of the first electrode (anode) 1113. The insulating substance 1114 may be formed by either an organic resin film or an insulating film comprising silicon. In the present embodiment, as for the insulating substance 1114, an insulating substance is formed in a shape as shown in FIGS. 10A and 10B by using a positive type photosensitive acrylic resin film.

For the purpose of enhancing a coverage effect, a curved surface having a curvature is to be formed in an upper end portion or a lower end portion of the insulating substance

1114. For example, when the positive type photosensitive acrylic resin is used as a material for the insulating substance 1114, it is preferable that a curved face having a curvature radius (0.2 μm to 3 μm) is provided only to the upper end portion of the insulating substance 1114. As for the insulating substance 1114, either one of a negative type which becomes insoluble to an etchant by photosensitive light, and a positive type which becomes soluble to the etchant by the light can be used.

Further, the insulating substance 1114 may be covered by a protective film comprising at least one film selected from the group consisting of: an aluminum nitride film, an aluminum oxynitride film, a thin film containing carbon as a main component, and a silicon nitride film.

A layer 1115 containing an organic compound is selectively formed over the first electrode (anode) 1113 by vapor deposition using vapor mask or ink-jetting. Further, a second electrode (cathode) 1116 is formed over the layer 1115 containing the organic compound. As for the cathode, a material having a small work function (for example Al, Ag, Li, Ca, alloys of thereof, that is, MgAg, MgIn, AlLi, $CaF_2$, or CaN) may be used. In the present embodiment, in order to allow luminescence to pass through, as for the second electrode (cathode) 1116, a thin metal film which is thin in thickness is formed, and a transparent conductive film (for example, an indium oxide-tin oxide alloy (ITO), an indium oxide-zinc oxide alloy ($In_2O_3$—ZnO), zinc oxide (ZnO)), or the like is/are laminated thereover. Note that the transparent conductive film is formed in order to reduce the electric resistance. Then, a light emitting element 1118 comprising the first electrode (anode) 1113, the layer 1115 containing the organic compound, and the second electrode (cathode) 1116 is fabricated. In the present embodiment, the light emitting element 1118 shall be an example of emitting white light; and therein, a color filter (for the purpose of simplicity, an overcoat layer is not shown) comprising a colored layer 1131 and a light blocking layer (BM) is provided.

Further, when layers each containing an organic compound which can obtain R, G, and B luminescence respectively, are selectively formed, a full-color display can be obtained without using a color filter.

A transparent protective layer 1117 is formed in order to seal the light emitting element 1118. The transparent protective layer 1117 may be preferably formed of an insulating film containing silicon nitride or silicon nitride oxide as its main components, which is formed by sputtering (DC type of RF type) or PCVD, a thin film containing carbon as its main component (for example, DLC film, or CN film), or a lamination layer comprising the above. A silicon nitride film having high blocking effects against impurity elements such as moisture, alkali metals, or the like can be formed by using a silicon target under an atmosphere comprising nitrogen and argon. A silicon nitride target may be used alternatively. In addition, the transparent protective layer can be formed by a film formation system that uses remote plasma. It is preferable that the total thickness of the transparent protective layer be formed to be thin as far as possible in order that light may pass through the transparent protective layer.

Further, in order to seal the light emitting element 1118, the sealing substrate 1104 is pasted to the substrate by the first sealing material 1105 and the second sealing material 1107 under an inert gas atmosphere. It is preferable to use such as an epoxy resin as a material for the first sealing material 1105 and the second sealing material 1107. It is also preferable that the first sealing material 1105 and the second sealing material 1107 inhibit transmission of moisture or oxygen as possible.

By sealing the light emitting element with the first sealing material 1105 and the second sealing material 1107 as described above, it becomes possible that the light emitting device can be completely encapsulated and penetration of moisture or oxygen from outside that causes deterioration of the light emitting element can be prevented.

This embodiment can be freely combined with any one of Embodiment Mode 1, Embodiment Mode 2, and Embodiment 1.

Embodiment 3

In this embodiment, an example of a sealing pattern different from the one in Embodiment Mode 1 is shown in FIG. 11.

An example of a top view of a sealing substrate (a second substrate 72) before pasting is shown in FIG. 11A. An example of forming a light emitting device having one pixel area from one substrates is shown in FIG. 11A.

Six bars of a first sealing material 76 are formed first on the second substrate 72 which is plastic by using a dispenser; thereafter, a few drops of a second sealing material having a lower viscosity than that of the first sealing material is applied thereon. The first sealing material 76 is arranged so as not to reach to terminal areas. FIG. 11A shows a top view of the state where the sealing material is applied to the substrate. Note that, the second substrate 72 which is plastic is shaped into a desired size beforehand.

The second substrate is then pasted a first substrate 71 provided with a pixel area 73 having light emitting elements, or a driver circuit portion 74 and a terminal area 75. The first substrate 71 may be a glass substrate or a plastic substrate. Note that, since a warp might be generated when the thermal expansion coefficients of the two substrates are different, the first substrate 71 may be formed from a material having the same coefficient of thermal expansion as the second substrate. A top view of the state immediately after pasting the pair of substrates is shown in FIG. 11B. The viscosity of the first sealing material is high, and therefore it spreads out very little upon pasting. The viscosity of the second sealing material is low; accordingly, the second sealing material spreads out planarly upon pasting. The second sealing material is squeezed out between the bars of the first sealing material 76, that is, in the direction of an arrow in FIG. 11B, toward opening portions. Air bubbles can thus be kept from existing in a region between the bars of the first sealing material 76, which is filled with the second sealing material. The first sealing material 76 does not mix with a second sealing material 77b, even if there is contact, and the first sealing material 76 has a viscosity such that the position at which it is formed is not changed by the second sealing material 77b. Note that, the first sealing material 76 includes a spacer (filler, minute particles and/or the like) which maintains a gap between the two substrate.

This embodiment can be freely combined with any one of Embodiment Mode 1, Embodiment Mode 2, Embodiment 1, or Embodiment 2.

Embodiment 4

Electronic devices can be produced by employing a light emitting device obtained by implementing the present invention to a display portion therein. Examples of the electronic devices can be given as a video camera, a digital camera, a goggle type display (head mounted display), a navigation system, an audio reproducing apparatus (car audio, an audio component, and the like), a laptop computer, a game machine, a portable information terminal (a mobile computer, a cellular phone, a portable game machine, an electronic book, etc.), and an image reproducing apparatus including a recording medium (specifically, an apparatus capable of processing data in a recording medium such as a Digital Versatile Disk (DVD) and having a display that can display the image of the data). Practical examples thereof are shown in FIGS. 12A to 12H.

Figure 12A:
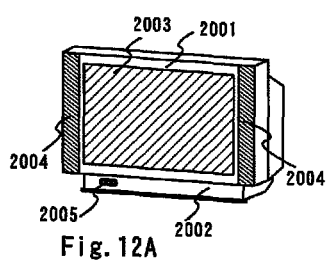
FIGS. 12A to 12H show examples of electronic devices (Embodiment 4)

FIG. 12A shows a television, which comprises a casing 2001, a supporting base 2002, a display portion 2003, speaker units 2004, a video input terminal 2005, etc. The present invention is applied to the display portion 2003. The term television includes every television for displaying information such as one for a personal computer, one for receiving TV broadcasting, and one for advertisement.

Figure 12B:
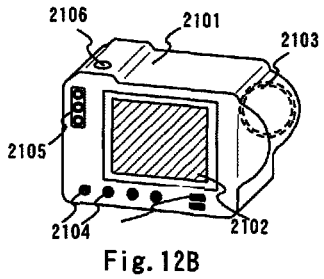

FIG. 12B shows a digital camera, which comprises a main body 2101, a display portion 2102, an image receiving unit 2103, operation keys 2104, an external connection port 2105, a shutter 2106, etc. The present invention is applied to the display portion 2102.

Figure 12C:
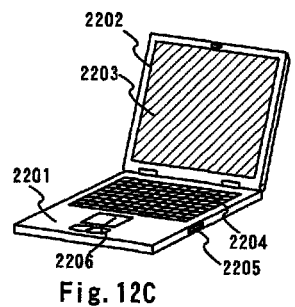

FIG. 12C shows a laptop computer, which comprises a main body 2201, a casing 2202, a display portion 2203, a keyboard 2204, an external connection port 2205, a pointing mouse 2206, etc. The present invention is applied to the display portion 2203.

Figure 12D:
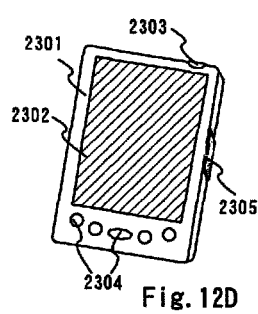

FIG. 12D shows a mobile computer, which comprises a main body 2301, a display portion 2302, a switch 2303, operation keys 2304, an infrared ray port 2305, etc. The present invention is applied to the display portion 2302.

Figure 12E:
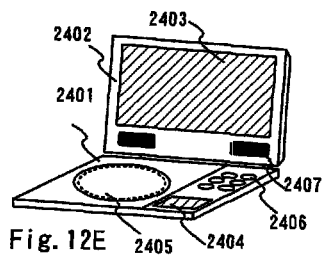

FIG. 12E shows a portable image reproducing apparatus equipped with a recording medium (a DVD player, to be specific). The apparatus comprises a main body 2401, a casing 2402, a display portion A 2403, a display portion B 2404, a recording medium (such as DVD) reading unit 2405, operation keys 2406, speaker units 2407, etc. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

Figure 12F:
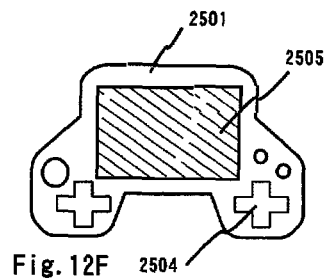

FIG. 12F shows a game machine, which comprises a main body 2501, display portions 2505, and an operation switch 2504. The present invention is applied to the display portion 2505.

Figure 12G:
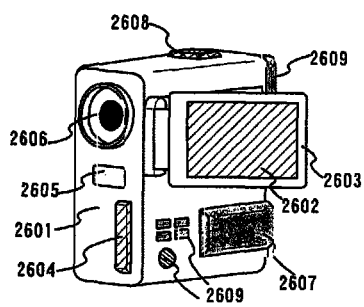

FIG. 12G shows a video camera, which comprises a main body 2601, a display portion 2602, a casing 2603, an external connection port 2604, a remote control receiving unit 2605, an image receiving unit 2606, a battery 2607, an audio input unit 2608, operation keys 2609 etc. The present invention is applied to the display portion 2602.

Figure 12H:
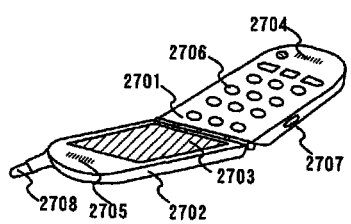

FIG. 12H shows a cellular phone, which comprises a main body 2701, a casing 2702, a display portion 2703, an audio input unit 2704, an audio output unit 2705, operation keys 2706, an external connection port 2707, an antenna 2708, etc. The present invention is applied to the display portion 2703. Power consumption of the cellular phone can be reduced by displaying white characters on a black background in the display portion 2703.

As described above, the light emitting device obtained by implementing the present invention may be used as display portions of any electronic device. The electronic devices described in this embodiment may use any structure of a light emitting device shown in Embodiment Modes 1, Embodiment Mode 2, or Embodiments 1 through 3.

According to the present invention, when a pair of substrates (particularly, flexible plastic substrates) is pasted together, a space between two substrates can be filled with a transparent sealing material without air bubbles mixing in. Thus, a light emitting device with high reliability can be obtained.

What is claimed is:

1. A light-emitting device comprising:
   a first substrate and a second substrate;
   a pixel portion comprising a plurality of light-emitting elements;
   a first sealing material between the pixel portion and an edge of the second substrate, the first sealing material including a portion extending along the edge of the second substrate; and
   a second sealing material covering the pixel portion between the first substrate and the second substrate, the second sealing material being in contact with the first sealing material,
   wherein the portion includes an opening,
   wherein the pixel portion is enclosed by the first substrate, the second substrate and the first sealing material, and
   wherein a part of the opening is filled with the second sealing material.

2. The light-emitting device according to claim 1, wherein the pixel portion is provided over the first substrate.

3. The light-emitting device according to claim 1, wherein the first substrate is a glass substrate.

4. The light-emitting device according to claim 1, wherein the first sealing material has higher viscosity than the second sealing material.

5. The light-emitting device according to claim 1, wherein at least one of the first sealing material and the second sealing material is an epoxy resin.

6. A light-emitting device comprising:
   a first substrate and a second substrate;
   a pixel portion comprising a plurality of light-emitting elements;
   a first sealing material between the pixel portion and an edge of the second substrate, the first sealing material including at least one opening; and
   a second sealing material covering the pixel portion between the first substrate and the second substrate, the second sealing material being in contact with the first sealing material,
   wherein the pixel portion is enclosed by the first substrate, the second substrate and the first sealing material,
   wherein a part of the one opening is filled with the second sealing material,
   wherein the first sealing material comprises a spacer, and
   wherein a part of the second sealing material is provided between the first sealing material and the edge of the second substrate.

7. The light-emitting device according to claim 6, wherein the spacer includes minute particles.

8. The light-emitting device according to claim 6, wherein the pixel portion is provided over the first substrate.

9. The light-emitting device according to claim 6, wherein the first substrate is a glass substrate.

10. The light-emitting device according to claim 6, wherein the first sealing material has higher viscosity than the second sealing material.

11. The light-emitting device according to claim 6, wherein at least one of the first sealing material and the second sealing material is an epoxy resin.

12. A light-emitting device comprising:
    a first substrate and a second substrate;
    a pixel portion comprising a plurality of light-emitting elements;

a first sealing material between the pixel portion and an edge of the second substrate, the first sealing material including at least one opening; and a second sealing material covering the pixel portion between the first substrate and the second substrate, the second sealing material being in contact with the first sealing material, wherein the pixel portion is enclosed by the first substrate, the second substrate and the first sealing material, wherein a part of the one opening is filled with the second sealing material, wherein each of the plurality of light-emitting elements comprises;
 a first electrode;
 a layer comprising an organic compound over the first electrode; and
 a second electrode over the layer, wherein the first electrode of one of the plurality of light-emitting elements is electrically connected to a transistor, wherein a color filter is provided between the second substrate and the second sealing material so that the white light is extracted to an outside through the color filter.

13. The light-emitting device according to claim 12, wherein the transistor is a thin film transistor.

14. The light-emitting device according to claim 12, wherein the plurality of light-emitting elements emit white light.

15. The light-emitting device according to claim 12, wherein the pixel portion is provided over the first substrate.

16. The light-emitting device according to claim 12, wherein the first substrate is a glass substrate.

17. The light-emitting device according to claim 12, wherein the first sealing material has higher viscosity than the second sealing material.

18. The light-emitting device according to claim 12, wherein at least one of the first sealing material and the second sealing material is an epoxy resin.

19. The light-emitting device according to claim 12, wherein the first electrode comprises nitrogen.

* * * * *